(12) United States Patent
Gama et al.

(10) Patent No.: US 12,730,140 B2

(45) Date of Patent: Sep. 8, 2026

(54) SYSTEM AND METHOD FOR ANALYSIS OF THE INSULATION CONDITION OF AN ELECTRICAL MACHINE BY THE PHASES, AND, STORAGE MEDIA

(71) Applicants: Usina Termeletrica Norte Fluminense S.A., Rio de Janeiro (BR); PS Soluções Indústria, Comércio Representações e Consultoria Ltda, Itajuba (BR)

(72) Inventors: Bruno Renó Gama, Curitiba Paraná (BR); Daniel De Almeida Arantes, Varginha Minas Gerais (BR); Isac Antônio Dos Santos Areias, Itajubá Minas Gerais (BR); Frederico de Oliveira Assunção, Itajubá Minas Gerais (BR); Erik Leandro Bonaldi, Itajubá Minas Gerais (BR); Levy Ely De Lacerda De Oliveira, Itajubá Minas Gerais (BR); Germano Lambert Torres, Itajubá Minas Gerais (BR); Luiz Eduardo Borges Da Silva, Itajubá Minas Gerais (BR)

(73) Assignees: Usina Termeletrica Norte Fluminense S.A., Rio de Janeiro (BR); PS Soluções Indústria, Comércio, Representações e Consultoria Ltda, Itajuba (BR)

( * ) Notice: Subject to any disclaimer, the term of this patent is extended or adjusted under 35 U.S.C. 154(b) by 133 days.

(21) Appl. No.: 18/436,110

(22) Filed: Feb. 8, 2024

(65) Prior Publication Data

US 2024/0319256 A1 Sep. 26, 2024

(30) Foreign Application Priority Data

Mar. 22, 2023 (BR) ........................ 102023005350 5

(51) Int. Cl.
*G01R 31/14* (2006.01)
*G01R 31/34* (2020.01)

(52) U.S. Cl.
CPC ............ *G01R 31/14* (2013.01); *G01R 31/34* (2013.01)

(58) Field of Classification Search
CPC .... G01R 31/14; G01R 31/12; G01R 31/1272; G01R 31/34; G01R 31/346; G01R 31/343; G01R 31/52
See application file for complete search history.

(56) References Cited

U.S. PATENT DOCUMENTS 4,887,029 A * 12/1989 Hemminger ............. G01R 5/00 324/142
2014/0084937 A1 3/2014 Neti et al.
2022/0336143 A1* 10/2022 Xu ............................ H01F 3/10
2023/0161300 A1* 5/2023 Yang ...................... G05B 19/04 318/16

FOREIGN PATENT DOCUMENTS

CN 113238165 A * 8/2021 .......... G06F 18/2411
CN 115552342 12/2022

OTHER PUBLICATIONS

European Search Report and the European Search Opinion Dated Aug. 21, 2024 From the European Patent Office Re. Application No. 24275014.9. (9 Pages).

(Continued)

*Primary Examiner* — Son T Le

(57) ABSTRACT

The present invention relates to a system for analyzing the insulation condition of an electrical machine (1), the electrical machine (1) comprising a housing (2), a plurality of supply conductors (3) and at least one grounding branch (5), in which it comprises: at least one scanning module (20) coupled to the plurality of conductors (3); at least one control module (9) coupled to the scanning module (20); and at least one analysis module (21) coupled to the control module (9); wherein the scanning module (20) is configured to inject and measure a plurality of high frequency voltage signals between the housing (2) of the electrical machine (1) and the plurality of conductors (3) and measure a plurality of high frequency currents circulating in the plurality of conductors (3) in response to the injection of each of the (Continued)

plurality of high frequency voltage signals; wherein the control module (9) is configured to control and synchronize the injections and measurements of the scanning module (20) and send the measurement data to the analysis module (21); wherein the analysis module (21) is configured to process the data received from the control module (9) and determine the condition of the insulation by calculating statistical indicators of the frequency response of the electrical machine (1). The present invention also comprises a method for analyzing the insulation condition of an electrical machine (1) using the system according to the present invention. Finally, the present invention comprises a storage medium comprising a set of instructions for carrying out the method according to the present invention.

20 Claims, 10 Drawing Sheets

(56) References Cited

OTHER PUBLICATIONS

Mahfouz et al. "Review: Frequency Response Analysis for Transformer's Status Diagnosis", 2022 23rd International Middle East Power Systems Conference, MEPCON, XP034281553, Cairo, Egypt, Dec. 13-15, 2022, p. 1-7, Dec. 13, 2022.

Communication Pursuant to Article 94(3) EPC Dated May 15, 2026 From the European Patent Office Re. Application No. 24275014.9. (7 Pages).

* cited by examiner

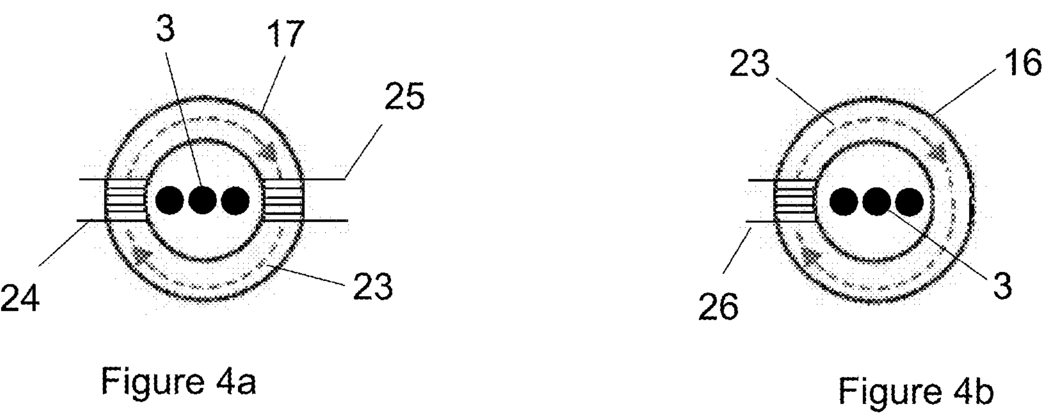
Figure 4a
Figure 4b
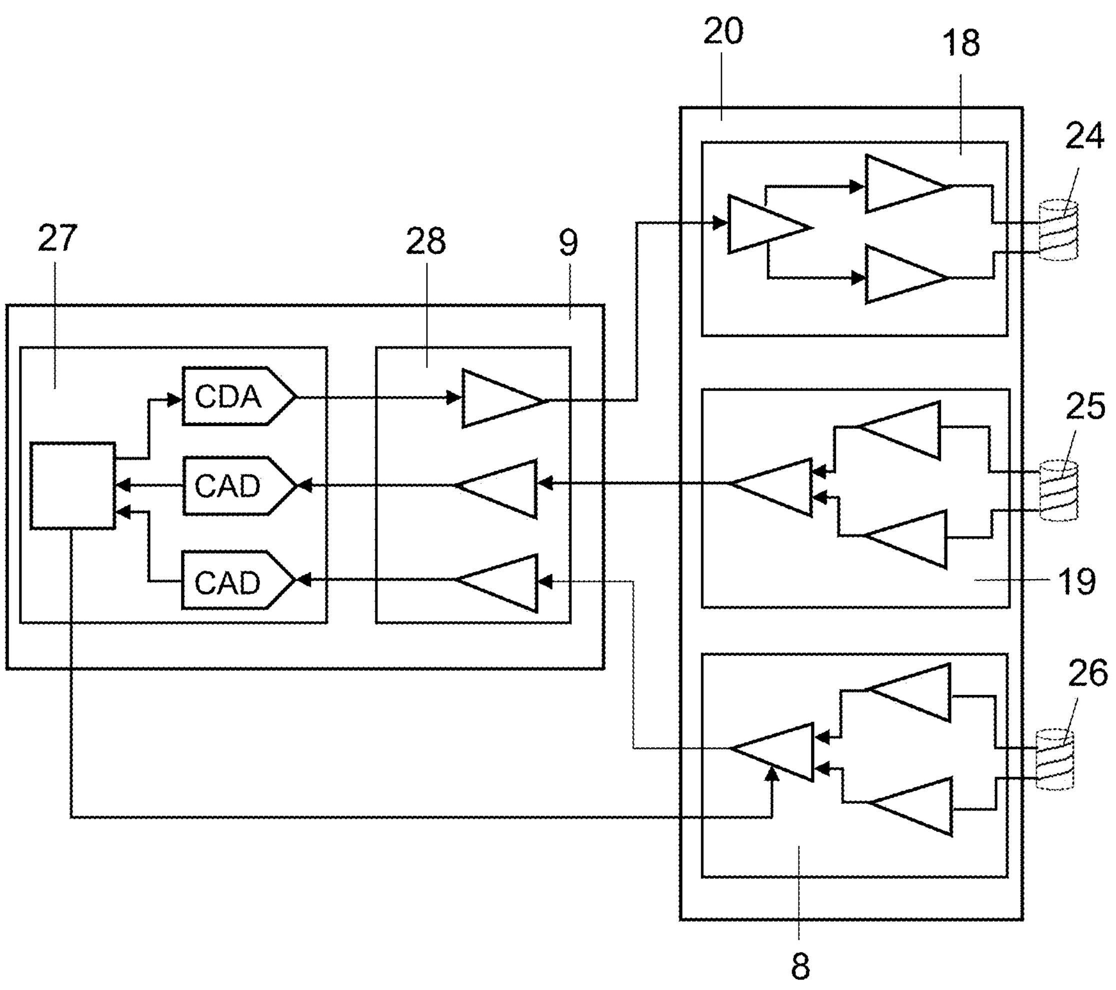
Figure 5

Figure 8:
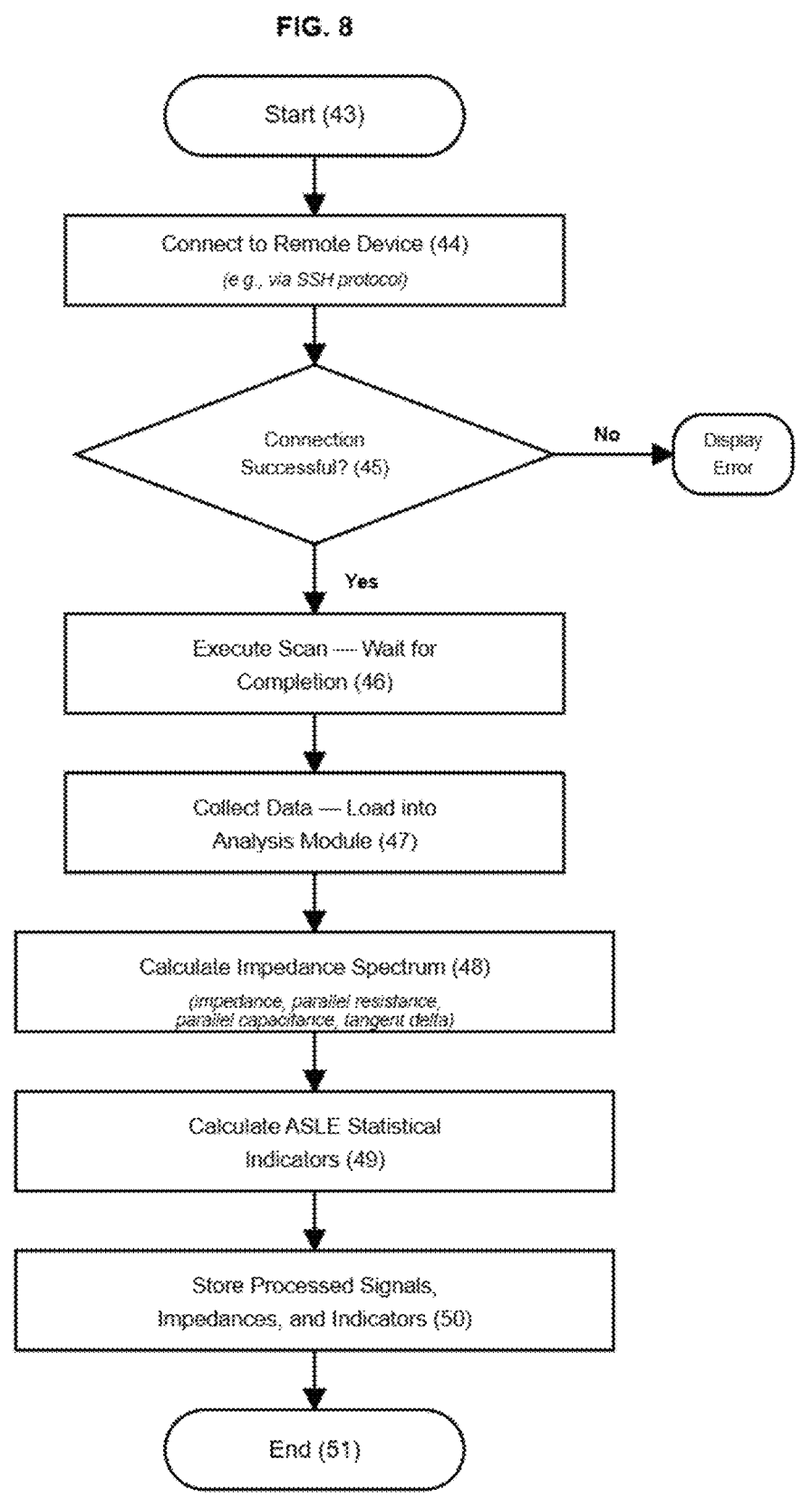

Start (43)

Connect to Remote Device (44)
*(e.g., via SSH protocol)*

Connection Successful? (45)

No

Display Error

Yes

Execute Scan — Wait for Completion (46)

Collect Data — Load into Analysis Module (47)

Calculate Impedance Spectrum (48)
*(impedance, parallel resistance, parallel capacitance, tangent delta)*

Calculate ASLE Statistical Indicators (49)

Store Processed Signals, Impedances, and Indicators (50)

End (51)

SYSTEM AND METHOD FOR ANALYSIS OF THE INSULATION CONDITION OF AN ELECTRICAL MACHINE BY THE PHASES, AND, STORAGE MEDIA

RELATED APPLICATION

This application claims the benefit of priority of Brazil Patent Application No. 102023005350 5 filed on Mar. 22, 2023, the contents of which are incorporated by reference as if fully set forth herein in their entirety.

FIELD AND BACKGROUND OF THE INVENTION

The present invention, belonging to the areas of electronics, computing and statistics, refers to a method and system that, through the injection and measurement of high frequency voltage signals between the conductors that supply an electrical machine and its housing, the measurement of currents in response to applied voltages and the analysis of the impedance spectrum, parallel resistances, parallel capacitances, delta tangents obtained performs the analysis of the condition of insulation of electrical machines in operation.

Through the use of signal processing and data interpretation algorithms, the impedance spectra, parallel resistances, parallel capacitances, delta tangents obtained from a given electrical machine to be evaluated are compared with the same parameters as when the machine is in a normal state, the so-called base spectrum, in order to assess the occurrence, even if incipient, of deterioration and partial discharges that degrade the insulation of electrical machines.

DESCRIPTION OF THE STATE OF ART

Electrical machines, especially motors, generators, and transformers, are equipment that transforms the electrical energy applied to them into another, which can be electrical or mechanical. They are part of industrial plants and electrical energy generation, transmission, and distribution systems. As they are some of the main assets of these high-cost enterprises and high operating expenses, their management directly affects a company's profit.

Electrical machines can be supplied with low voltage (220 V to 1,000 V), medium voltage (1,000 V to 138,000 V) and high voltage (greater than 138,000 V). A large number of motors are powered by frequency inverters that vary the rotation speed of the three-phase induction motor. This allows you to control the power consumed by it by varying the frequency that powers it, substantially improving its energy and operational efficiency.

The abnormal operating condition of premature failures in the insulation of electrical machines may arise from factors such as: design flaws, aging of the materials applied, manufacturing flaws or maintenance failures. Final insulation failure is caused by electrical breakdown through a drain channel. The formation and propagation of flow channels in the insulating medium, therefore, is one of the factors of great importance in the process of deterioration of the machine's electrical insulation.

The uninterrupted use of many machines requires that their operational conditions, and in particular their electrical insulation, be evaluated when they are in operation. This makes it possible to detect existing deteriorations early and be able to plan maintenance or replacements in advance. Consequently, losses due to unscheduled downtime are avoided, which bring great technical and financial losses to the plants where they operate.

Traditionally, companies, in their maintenance programs, provide periodic stops to assess their electrical machines' operational conditions and insulation. This is accomplished via the use of direct measurements that measure insulation resistances and analysis of the physicochemical conditions of the insulation liquid in oil-insulated electrical machines. These are called preventive maintenance.

A few decades ago, many companies also adopted predictive maintenance, which provides early detection of insulation deterioration while electrical machines are in operation. The most commonly used techniques are: Analysis of Mechanical Vibrations emitted by the machine, Acoustic Analysis and Radiofrequency Analysis of abnormal weak signals generated by partial discharges, and Frequency Response Analysis-FRA. FRA consists of the application of low voltage and high-frequency signals to the machine, combined with severity indicators related to its internal impedance, capable of carrying out an operational diagnosis of its insulation and the need or not for scheduled stoppage for future maintenance or replacement of the electrical machine under analysis.

About two decades ago, verification of the operational conditions of indirectly energized engines and generators began, through continuous monitoring of some variables that determine their operational states when compared with the pre-established standards of their normal operating condition. The purpose is to determine the optimal time to carry out the stoppage for repair or replacement; that is, the machine is supervised to detect early failures capable of leading to unscheduled or catastrophic downtime.

With the evolution of digital electronics, microprocessors and computer equipment at the end of the last century, analyzes in the frequency domain, and in particular Fourier Analysis, became viable for widespread use in digital signal processing. Through this technique of periodic signals in the frequency domain, the techniques of Motor Current Signature Analysis—MCSA, Voltage Signature Analysis—VSA, and Instantaneous Power Signature Analysis—IPSA.

The use of these techniques independently or in combination makes it possible to evaluate the technical operational conditions of engines and generators, both from an electrical and mechanical aspect. Basically, they identify the magnitudes and frequencies of the individual harmonic components that constitute the current, voltage and power signals, analyzing them. With knowledge of its normal operation, they indicate abnormalities in the elements that constitute it. This allows patterns to be identified to differentiate "healthy" engines from failing engines and often even detect in which components they occur.

The MCSA, VSA and IPSA techniques are efficient and consolidated for diagnosing the occurrence of faults in electrical machines, but they are more suitable for faults in the rotor circuit (e.g., evaluating breakage of bars, breakage of the short-circuit ring, hot spots in the rotor, oval rotor, etc.), unbalance and mechanical misalignment, problems in the coupled load or in the coupling itself, short circuit in the stator windings, among others. On the other hand, these techniques are not efficient for diagnosing and monitoring the evolution of problems early in the insulation of electrical machines.

Currently, Frequency Response Analysis-FRA is best suited to analyzing the level of deterioration of insulation in electrical machines. It was initially used in the diagnosis of power transformers and recommended in the IEEE-STD-C57.149-2012 standard "*Guide for the Application and*

*Interpretation of Frequency Response Analysis for Oil-Immersed Transformers*"; but the application of FRA in rotating machines remains in an experimental state, as presented in 2011, PLATERO C. A.; et al., in "Influence of Rotor Position in FRA Response for Detection of Insulation Failures in Salient-Pole Synchronous Machines" where the application is made in the FRA laboratory to diagnose the insulation of rotating machines, relating the insulation resistance values to faults in the stator of a motor.

In 2016, some inventors of this patent SANTANA W. C.; LAMBERT-TORRES G.; SILVA L. E. B.; E. BONALDI; OLIVEIRA L. E. L.; SALOMON C. P.; SILVA C. P. B. published "*Influence of Rotor Position on the Repeatability of Frequency Response Analysis Measurements on Rotating Machines and a Statistical Approach for More Meaningful Diagnostics*", describing the injection of high-frequency alternating signals and the measurement of voltages and currents for each simulated fault condition in the machine under test. The relationships between the injected and measured signals are capable of determining a parameter (e.g., impedance, admittance, gain, etc.) that varies depending on the high-frequency, which can produce indications regarding the state of "health" of the electrical machine when compared to its history of evolution, via the use of statistical techniques.

Commercially, equipment is available with the names "*LCR Meter", "Frequency Response Analyzer", "Vector Network Analyzer" or "Impedance Analyzer*" that uses the FRA technique to obtain the exact image of the impedance of electrical circuits, of electronic components and electronic devices. This equipment uses only a pre-selected high-frequency signal for the injected current, but more sophisticated models scan a frequency spectrum over an extensive range; however, both types can only be used with the load under analysis de-energized. This is why they are recommended in preventive and non-predictive maintenance tests, as they require that the electrical machine to be analyzed periodically and removed from operation. Especially in large electrical machines that are used continuously, this procedure is unfeasible as they can rarely be de-energized.

The diagnosis of an electrical machine in which the FRA technique was applied is carried out by comparing the impedance spectrum obtained in a given measurement with the spectrum of the machine when in normal condition—the base impedance spectrum. Such analysis requires effort and expertise on the part of the user. For the interpretation of this comparison to become more palpable, the analysis more objective, and the diagnosis more assertive, in 2005, KIM, J. W.; et al. in "*Fault Diagnosis of a Power Transformer Using an Improved Frequency-Response Analysis*" suggested the use of statistical indicators.

In 2019, Bruno Renó Gama, one of the inventors of this patent, in his master's thesis entitled "*FPGA System for Early Detection of Damage in the Insulation of Electrical Machines Based on Impedance Spectrum Analysis*" showed that the use of the statistical indicator ASLE—Absolute Sum of Logarithmic Error is suitable and efficient to assist in comparative interpretations between impedance spectrum curves.

In a search in the patent database of the National Institute of Industrial Property—INPI, the following processes were found in the technical field of the present invention.

Patent document BR102020019149-7, entitled "Active Device for Directing High-Frequency Current in an Energized Electrical Network, and, System and Method for Testing Electrical Machines Online through Frequency Response Analysis", from the same applicants and some inventors of this patent. This document describes an active filter for directing high-frequency current in an energized electrical network, this active filter comprises a measuring sensor for measuring a current injected at a point on the electrical network, wherein the electrical current at said point of the network has a low-frequency portion and a high-frequency portion, a high-pass filter to extract a high-frequency portion of the current, a controller that receives the high-frequency current extracted by the high-pass filter as an error signal and injects a voltage through the injection coil to generate at that point in the network a high-frequency voltage drop in the opposite direction to the high-frequency current and prevent it from circulating in the electrical network, the measuring sensor and the injection are composed of a Rogowski effect coil.

There is also patent document BR102020019156-0, entitled "Active Filter Device, Active System for Testing Electrical Machines or Transmission Lines During Operation, and, Method for Performing Measurements on an Electrical Machine or a Transmission Line in Operation" from the same depositors and some inventors of this patent. This document describes an active filter for blocking high voltage from the electrical network and electronic equipment, which is the FRA, composed of a high voltage transducer to measure a voltage at a high voltage point of an electrical system comprising the electrical network and an electrical machine, a second high voltage transducer to measure a voltage between the high voltage point and a low voltage point close to the electronic equipment, a PWM control circuit that generates pulses to control a PWM inverter, the PWM inverter generating an opposing high voltage between the high voltage point of the electrical system and the low voltage point next to the electrical equipment whose PWM modulated voltage at its output is filtered by an LC filter, in which the opposing high voltage is identical to the fundamental component of the high voltage of the electrical network and 180° out of phase so that they cancel each other out at the low voltage point of the electronic equipment.

Patent document BR102022017212-9 was also found, entitled "System and Method for Analysis of the Insulation Condition of an Electrical Machine by Grounding, and Storage Media", again from the same applicants and some inventors of this patent. This document, in turn, describes a system for analyzing the insulation condition of an electrical machine, comprising a housing and at least one grounding branch, composed of a scanning module coupled to the grounding branch, a control module coupled to the scan module, and an analysis module coupled to the control module, with the scan module configured to inject and measure high-frequency voltage signals between the electrical machine housing and ground via the ground branch(es) and measure high-frequency currents flowing in the ground branch(es) in response to the injection of at least one high frequency voltage, with the control module configured to control and synchronize the scan module injections and measurements and send the data from measurements to the analysis module that processes the received data and determines the insulation condition by calculating statistical indicators of the frequency response of the electrical machine, the method that generates a plurality of high-frequency voltages in the grounding branch, acquires data from the plurality of high-frequency voltage and current signals from the ground branch(es), and calculates at least one impedance spectrum and calculates at least one statistical indicator to determine the insulation condition of the electrical machine, finally comprises a storage medium that comprises instructions for completely carrying out the method.

There is patent document BR102017008092-7, entitled "Method for Assessing the Insulation of Rotating Electrical Machines and Equipment for Carrying Out this Method". This document describes a method and equipment comprising the steps of identifying the machine's nominal voltage (Vn), applying test voltages to the electrical machine (V), measuring the machine's polarization index (PI), the leakage current (I), the partial discharge (PD), the power factor angle (tan δ), process the measured values of these parameters, automatically determine the degrees of deterioration and contamination of the insulation based on the measured parameters and automatically generate an overall assessment of the insulation taking into account the degree of contamination and the degree of deterioration of the insulation.

Finally, there is patent document BR112014002484-7, entitled "Method and Device for Testing an Insulation in an Electrical Machine During Operation of the Machine" which describes a method and a device for online detection of a deterioration in the state of an insulation in an electrical machine, where a voltage in steps is applied to the winding(s) of the machine with the aid of a converter, and the current induced in this way and/or the time derivative (di/dt) thereof is acquired as a measurement signal with the aid of at least one sensor and is then oversampled with a frequency higher than the characteristic frequencies for tuning, the signal obtained by said oversampling is then evaluated concerning the parameters of the tuning process such as overshoot (Ah) and/or natural frequency (I/ΔT) and/or constant damping, to detect any deterioration in insulation.

In a search in the patent database of the United States of America—USPTO, the following processes were found in the technical field of the present invention.

The U.S. Pat. No. 6,035,265 titled "System for Providing Low-Cost Excitation to Stator Winding to Generate Impedance Spectrum for Use in Stator Diagnostics", which describes a system for predicting damage to the stator windings in a motor during operation, via a wideband test that measures changes in capacitance between individual windings as changes occur in the wideband impedance response of the stator winding, through by using high frequency signals and monitoring their impedance, for example a voltage sensor and a current sensor can be coupled to power lines feeding the windings to determine an impedance (impedance=voltage/current), the system includes a signal generator coupled to a power line supplying power to the motor, the signal generator introducing a high frequency signal into the power line, and a sensor coupled to the power line, the sensor monitoring the electrical characteristics of the power line during the introduction of the high frequency signal to facilitate the determination of a power line impedance, a microprocessor that processes the detected voltage and the detected current to facilitate the determination of a power line impedance, and a communications system adapted to allow communication between the microprocessor and the host computer.

There is also U.S. Pat. No. 6,483,319, entitled (in free translation) "Method for Conducting Broadband Impedance Response Tests to Predict Stator Winding Failure". This document describes a wideband test procedure to detect the onset of damage and failures in the stator winding insulation via the changes in capacitance between the individual windings by the baseline impedance response defined in a wideband at frequencies above the motor operating frequency range in which current flowing through the stator winding has a significant capacitive component; probes the winding at a plurality of frequencies to determine its measured impedance response, compares the measured and baseline impedance responses to detect the onset of failure, to determine the magnitude, frequency, and width of the winding's resonant impedance across frequency sweep.

Furthermore, U.S. Pat. No. 6,549,017, entitled (in free translation) "System and Method for Real-Time Impulse Frequency Response Analysis". This document describes a unit for energized winding testing and determines the characteristic signature of the monitored winding of a transformer, generator, or similar by comparing the applied input pulses with the output pulses after each input pulse has propagated through the winding.

In turn, there is also U.S. Pat. No. 8,766,645, entitled (in free translation) "Method and Device for Tracking the Degradation of Insulation in a Rotating Machine" which describes a method that comprises measuring the concentration of CO and the concentration of $NO_2$ and $O_3$, in one or more locations situated or in contact with the gases that form the internal atmosphere of said rotating machine, display and/or signal and/or store the results of said measurement, analyze the results of said measurement, detecting a considerable increase in the concentration of CO, in the case where the concentrations of $O_3$ and $NO_2$ do not increase simultaneously and take maintenance measures that are decided on a basis that incorporates at least the analysis carried out previously.

There is also U.S. Pat. No. 9,229,043, entitled (in free translation) "Partial Discharge Sensor for a High Voltage Insulation Monitoring Device" which addresses a sensor including a monitoring device that can also be calibrated with the electrical generator connected to the network, a partial discharge sensor, a sensor may have one or more of the following optional features alone or in combination, a coupling capacitor and a calibration capacitor realized as a dual capacitor, the coupling capacitor and the calibration capacitor realized as two single capacitors, a measurement circuit which comprises the signal transmission line for operation of the measuring circuit and the calibration circuit that is supplied through the signal transmission line, a converter power circuit that connects to the measuring device and coupled to the low voltage electrode of the measuring capacitor to supply the calibration circuit with the required supply voltage, a calibration circuit comprising the pulse generator synchronization line connected between the coupling capacitance and the calibration circuit including two branches connected in parallel, a first branch connected on one side to earth and on the other side to a switching unit and a second branch comprising in parallel a capacitor and a signal generator, one end of the second branch being connected to earth and the other end also connected to the switching unit, the switching unit being connected to the calibration capacitor, the switching unit has two positions, a first position connecting the calibration capacitance to the first branch and a second position connecting the calibration capacitance to the second branch and a serial communication channel connected to the measuring device to adjust the height and sequence of pulses and/or to control the switching unit.

Furthermore, U.S. Pat. No. 9,255,970, entitled (in free translation) "Real-Time Monitoring of Stator Insulation in Motors and Generators". Such patent describes an electronic system with a first current transformer configured to enclose a first pair of phase cables of a variable speed drive (VSD)

powered AC motor or electrical generator, a second current transformer configured to enclose a second pair of phase cables from the VSD feeder AC motor or electrical generator and a third current transformer configured to enclose a third pair of phase cables from the AC motor fed by the VSD or electrical generator, a microcontroller configured to monitor the respective voltages generated by the first, second and third transformers and to determine the insulation characteristics of the AC motor fed by VSD or electrical generator based on the monitored leakage currents.

Although existing methods, equipment and systems are capable of evaluating failures and deterioration in the insulation of electrical machines, they have the following restrictions on use:

- The use of a megohmmeter requires that the electrical machine to be analyzed is de-energized.
- Vibration analyzes and detection of acoustic and radio frequency signals arising from partial discharges are influenced by noise interference and electromagnetic interference generated in the electrical machines under test and in the environment in which they are located;
- Available commercial equipment that uses the FRA technique to obtain the exact impedance image requires de-energizing the electrical machine to be analyzed;
- The methods and systems described in national patent documents BR102020019156-0 and BR102020019149-7, from the same applicants of the invention patent presented here, are effective in evaluating insulation deterioration and detecting early defects in energized electrical machines, but filters blocking high voltage and injected current have large physical dimensions and high costs;
- The method and system described in the national patent document BR102022017212-9, from the same applicants of the invention patent presented here, are effective and can be used in energized electrical machines, but when they are connected to the ground by a single solitary ground, or using several systems one for each grounding branch in the case of multiple grounding points; that is, for multiple grounding points, multiple systems must be used, which can make the solution more expensive;
- The method presented in national patent document BR102017008092-7 is only applicable to de-energized machines and is only capable of detecting the occurrence of partial discharges and not the deterioration of electrical insulation;
- The method and device described in national patent BR112014002484-7 are applied to de-energized machines and is capable of detecting deterioration in the electrical insulation of both oil-insulated and dry-insulated machines;
- The systems described in U.S. Pat. Nos. 6,035,265 and 6,483,319 use broadband tests to detect the onset of damage and failures in stator winding insulation via changes in capacitance between its windings, even with the motor running, and if restrict to evaluating only the insulation of the stator and not the entire machine, and do not apply to electrical energy transformers;
- The system and method described in the—North American U.S. Pat. No. 6,549,017 type FRA to detect existing faults in windings does not prevent the high-frequency current from being prevented from circulating in the electrical network and other loads connected in parallel with the machine under analysis, a fact that reduces the credibility of the impedance results obtained;
- The method and device described in the—North American U.S. Pat. No. 8,766,645 performs the physical-chemical analysis of the insulation environment to detect CO and $NO_3$ arising from the occurrence of tracks, detects failures and not the early state of deterioration of the insulation of electrical machines;
- The sensor described in the—North American U.S. Pat. No. 9,229,043 is only capable of detecting the occurrence of partial discharges in electrical machines powered by medium and high voltages and not the early state of deterioration of the insulation of electrical machines;
- The method described in the—North American U.S. Pat. No. 9,255,970 compares the phase currents that feed a motor or generator and, via differential analysis, detects leakage currents; Such a method is not capable of detecting degradation, but only failures occurring in electrical insulation.

OBJECTIVES OF THE INVENTION

It is an objective of the present invention to obtain a method and a system capable of monitoring and early detection of failures and deteriorations in the insulation of the electrical machine, the machine being: de-energized or energized; at low, medium or high voltage; at industrial frequency or other operating frequency; energized by the electrical energy network that supplies it or by power through a frequency inverter; whether the power cables are independent, multiplexed or shielded.

Another objective of the present invention is for the system to operate alongside electrical machines regardless of the type of grounding used by them (solitary grounding, multi-grounding or structural grounding).

It is also the objective of the present invention to provide a method and system capable of carrying out measurements without interfering, even minimally, with the grounding and power supply conductors of the electrical machine.

Finally, it is also the objective of the present invention to design software for monitoring and processing FRA data with a user-friendly Human Machine Interface-HMI for remote use.

Taking into account the aspects and problems presented in the methods, equipment, and systems previously described in the current state of the art, and to overcome them, new and unprecedented systems and methods were developed in the present invention patent. This system uses the FRA technique in a new configuration for continuous monitoring and for the analysis of failures and deterioration of the insulation of energized electrical machines, via the injection and measurement of high-frequency currents through the conductors that supply the electrical machine. This new configuration allows the FRA to be carried out regardless of whether the machine is powered by low, medium, or high voltage, despite the number of loads connected in parallel in the electrical circuits that power it, the types of power cables (independent, multiplexed, or shielded) and the types of grounding (single, multi, or structural grounding). The impedance spectrum, parallel resistances, parallel capacitances, and delta tangents are compared with the respective base spectra using the statistical indicator ASLE—Absolute Sum of Logarithmic Error. The ASLE is capable of accurately predicting whether the machine under analysis needs to be shut down for future maintenance or replacement.

SUMMARY OF THE INVENTION

The techniques listed above for analyzing the deterioration of the insulation of electrical machines in operation have major restrictions on their use; Mechanical Vibration Analysis, Acoustic Analysis, and Radio Frequency Analysis due to the interference caused by vibrations, noise, and electromagnetic interference generated by them and existing in the environments they work; and the Frequency Response Analysis (FRA) technique is due to the equipment used to inject and measure high-frequency currents in the machines is made up of electronic circuits with low supply voltages that cannot withstand the mains voltages that supply the machines under analysis. To solve this limitation, FRA systems require large, expensive coupling filters that make them unfeasible to use, especially in machines powered by medium and high voltages.

Another restriction on the use of FRA is that power grids with several loads connected in parallel can offer a much lower impedance to the injected high-frequency current than the machine under analysis, resulting in deviations of the injected current to the grid and very little current to the machine under analysis, which implies the need for high power from the high-frequency voltage generating source.

Another very restrictive aspect for testing the insulation of induction motors in operation powered by frequency inverters is that they are powered by bundled and shielded cables to protect the PLCs (Programmable Logic Controllers), and the inverters themselves from electromagnetic interference (EMI/RFI), noise and harmonic currents they generate.

The method and system described in this patent for the early detection of faults and deterioration in the insulation of electrical machines has a new and unprecedented configuration, which allows it to be used in all types of motors, generators, and electrical transformers, regardless of the voltage levels they operate at, the number of loads connected to the electrical circuits feeding them, the types of cables feeding them (independent, multiplexed or shielded) and the types of grounding (single, multi, or structural grounding).

The method and system for detecting faults and deterioration in the insulation of electrical machines presented here basically consists of the Scanning Module, made up of an injection coil that applies and measures high-frequency voltage signals between the conductors supplying the single-phase, two-phase or three-phase electrical machine and its housing, a current measurement coil that measures the intensities of the high-frequency currents circulating through the electrical machine; through the Control Module which synchronizes the injections and readings of the high frequency signals to obtain the impedance spectrum, parallel resistance, parallel capacitance, and tangent delta of the machine's electrical insulation; and through the Analysis Module. The Analysis Module uses the ASLE (Absolute Sum of Logarithmic Error) statistical indicator to provide the level of deterioration in the insulation, and the HMI (Human Machine Interface) acts as a mediator between the user and the detector system.

The new system and method for analyzing the insulation condition of electrical machines consists of injecting high-frequency signals into the conductors that feed the machine and, by measuring the currents that are being injected, and the voltage drops measured in the machine, the voltages between its power supply and ground, obtaining its impedance spectrum and, from this spectrum, obtaining the spectra of parallel resistances, parallel capacitances, and delta tangents. As the greatest impedance is that of the machine's electrical insulation, it is this that is preponderant in the final result obtained.

More specifically, the system according to the present invention for analyzing the insulation condition of an electrical machine, the electrical machine comprising a housing, a plurality of supply conductors and at least one grounding branch, the system comprising:

- at least one scanning module coupled to a plurality of supply conductors;
- at least one control module coupled to the scanning module; and
- at least one analysis module coupled to the control module;
- in which the scanning module is configured to inject and measure a plurality of high-frequency voltage signals between the electrical machine housing and the plurality of conductors, and to measure a plurality of high-frequency currents circulating in the plurality of conductors in response to the injection of each of the plurality of high-frequency voltage signals;
- in which the control module is configured to control and synchronize the injections and measurements of the scanning module and send the measurement data to the analysis module;
- in which the analysis module is configured to process the data received from the control module and determine the condition of the insulation by calculating statistical indicators of the frequency response of the electrical machine.

In turn, the method according to the present invention for analyzing the insulation condition of an electrical machine using the system according to the present invention, the electrical machine comprising a housing, a plurality of supply conductors and at least one grounding branch, the method comprising:

- generate, via at least one scanning module, predetermined high-frequency voltage signals on a plurality of conductors;
- acquire, through at least one scanning module, data from a plurality of voltage signals and a plurality of high-frequency currents in a plurality of conductors;
- store the acquired data via the control module;
- collect and upload the data acquired by the control module to the analysis module;
- calculate at least one impedance spectrum using the analysis module;
- calculate, using the analysis module, at least one statistical indicator from at least one impedance spectrum to determine the condition of the electrical machine insulation.

The method and system presented here incorporate Sweep Frequency Response Analysis (SFRA), which is an impedance spectroscopy technique for assessing the integrity of dielectric materials by measuring their electrical transfer functions over a wide frequency range, for example from 1 KHz to 10 MHz.

In this technique, the electrical machine insulation displays a specific frequency response curve. The applied sinusoidal voltages provide different output voltages and currents for the different frequencies. This means that by increasing the frequencies of the input signals without changing their voltage levels, different output voltages are obtained at the different frequencies applied, depending on the nature of the RLC impedance of the dielectric that forms the electrical insulation of the machine. Plotting these output voltages against the corresponding frequencies provides a specific pattern for the insulation, called the Impedance Signature.

After using the machine for a given period of time, the occurrence of internal faults, transient switching impulses, etc. are detected in the Impedance Signature and if new SFRA tests are carried out and the acquired Signatures are superimposed with the previous standards, some deviations between these graphs will be observed. This means that, through more in-depth studies, it is possible to associate these displacements with deterioration in the dielectric characteristics of the electrical insulation.

The comparison of the electrical machine's Impedance Signature curves usually shows subtle differences that require a highly qualified analyst to carry out the analysis and conclude the diagnosis, and even then, the final opinion will be subject to the analyst's subjectivities. A practical way to avoid this is to use statistical indicators to compare the curves.

In the method and system presented in this patent, the statistical indicator used, ASLE—Absolute Sum of Logarithmic Error, is suitable for comparing differences between data sets presented on a logarithmic scale. Its value is dimensionless and indicates the difference between two sets of data. The higher the index value, the greater the difference between the sets. Thus, considering a base impedance spectrum y[i] with n frequency points, and an impedance spectrum under analysis x[i], also with n frequency points, the following equation is used to calculate the index.

$$ASLE = \frac{\sum_{i=1}^{n} |20\log_{10} y[i] - 20\log_{10} x[i]|}{n} \quad (1)$$

where x[i] is the impedance value of the spectrum to be analyzed, as a function of frequency; y[i] is the impedance value of the base spectrum, as a function of frequency; n is the number of points in the impedance spectrum.

With the new configuration for injecting high-frequency currents and measurements, and the consequent elimination of voltage blocking and current blocking systems, the level of complexity of the SFRA method and system for use in energized electrical machines presents a solution that is non-invasive, compact, and scalable for use at all voltage levels of the power supply network, without the need to modify the size and main characteristics of the method and system.

ADVANTAGES OF THE INVENTION

The method and system for detecting faults and deterioration in the insulation of electrical machines in operation or not, described in this patent, has several advantages, in particular the injection and measurement of high-frequency signals through the conductors that feed the electrical machine.

Other advantages include a new and unprecedented configuration for injecting and measuring the high-frequency voltage signals and measuring the currents circulating through the set of conductors that feed the electrical machine; the control algorithm for scanning the generation of the injected high-frequency signals and the voltage and current readings obtained; and the use of the statistical indicator ASLE—Absolute Sum of Logarithmic Error.

The method and system with these innovations have the following advantages in detecting faults and assessing the deterioration of electrical machine insulation compared to existing methods, equipment, and systems in the current state of the art:

- To be used in low, medium, and high voltage motors, generators and transformers that use dry insulation or insulating oil;
- Easy to install;
- Technical and economic feasibility of being used on a large scale due to its low cost;
- No user specialization is required to use the system;
- Avoid unnecessary machine stoppages to assess insulation;
- Reduce the risk of abrupt failures in the insulation of electrical machines and consequent unscheduled or catastrophic downtime;
- Increase the reliability of the installations where the electrical machines under analysis are installed; and
- Reduce the risk of penalties for electricity companies for non-compliance with the supply of energy agreed with the regulatory body in facilities of the National Electricity Sector-SEN.

BRIEF DESCRIPTION OF THE SEVERAL VIEWS OF THE DRAWINGS

The present invention is illustrated by way of example, but not limited to, in the attached figures.

FIGS. 4*a* and 4*b* show the schematic diagrams of the current reading coil and the injection coil, which are coupled to the power supply conductors of the electric machine.

FIG. 5 shows a more detailed view of the hardware blocks of the scanning and control modules.

FIG. 6 shows a preferred flowchart of a control module algorithm.

FIG. 8 shows a preferred flowchart of the scanning algorithm responsible for the process of generating, acquiring, and processing signals at one or more frequencies in the analysis module.

DESCRIPTION OF SPECIFIC EMBODIMENTS OF THE INVENTION

This section presents, in detail, the method and system of the present invention, referring, where necessary, to the figures described in the previous section.

Firstly, it should be noted that unless explicitly stated otherwise, the term "conductor(s)" throughout this document is used interchangeably to refer to phase and/or neutral wiring (in the case of single-phase machines).

Figure 1:
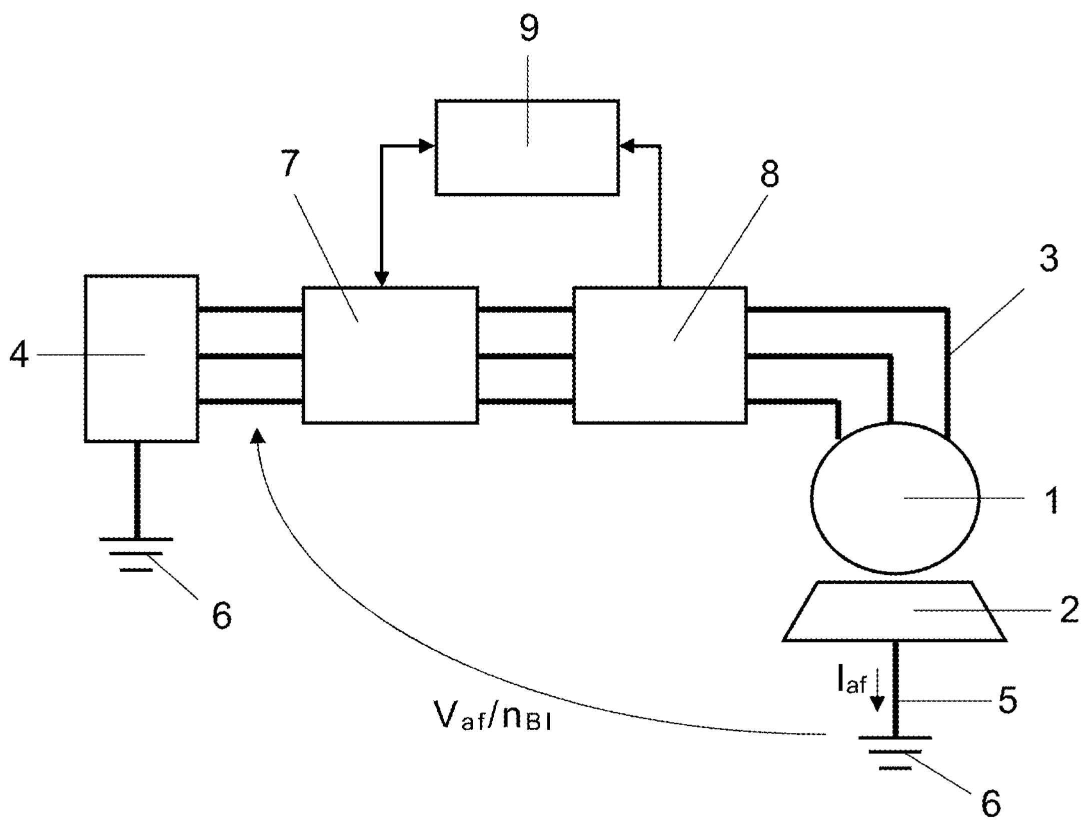
FIG. 1 shows a simplified configuration of the system according to the present invention.

FIG. 1 shows a simplified configuration of a system for analyzing faults and deterioration in insulation, according to the present invention, applied to an electrical machine 1. A plurality of supply conductors 3, here exemplified by a three-phase system of electrical machine 1, are connected to a supply system 4, here exemplified by a generator (which can also be a transformer or a frequency inverter, or even a short circuit in the case of analysis with the machine out of service). The housing 2 of the electrical machine 1 is connected to the grounding mesh 6 via one or more grounding branches 5 (which can be single, multipoint or structural). Note that the plurality of supply conductors 3 can be independent, multiplexed or shielded cables.

The essence of the method according to the present invention comprises carrying out, through a voltage generator and reader block (7), the application of a plurality of high frequency voltage signals $V_{af}/n_{BI}$ via electromagnetic induction between the supply conductors 3 that feed the electrical machine 1 and the housing 2 of the electrical machine 1. These generated and applied voltages result in a plurality of high frequency current signals $I_{af}$ which circulate between the power supply conductors 3, the housing 2 of the electrical machine 1, the grounding branch 5, the grounding mesh 6 and the power supply system 4. The total current $I_{af}$ is then read by the current reader block 8, and the voltage of interest in the electrical machine 1, that is, the voltages developed between the supply conductors 3 and the housing of the electrical machine 2 are read by the generator block and voltage reader 7 in order to obtain the impedance of the electrical machine 1 under analysis.

Both the generation and readings of high frequency voltage signals $V_{af}/n_{BI}$ and the readings of high frequency currents $I_{af}$ are synchronized by the control module 9.

In this configuration, the proposed injection and reading system eliminates the need to use a voltage blocking system, since the electrical potentials in the voltage generator and reader block 7 and the current reader block 8 do not endanger the electronic circuits of the respective blocks or the control module 9. This also eliminates the need for a current routing system, since the electrical circuit is closed via the electrical machine 1, the supply conductors 3, the housing 2 of the electrical machine 1, the grounding branch 5, the grounding mesh 6, and the supply system 4, depending on the position of the generator block and voltage reader 7, the current reader block 8 and the control module 9, so that no current can escape to other equipment connected in parallel to the supply system 4.

Figure 2:
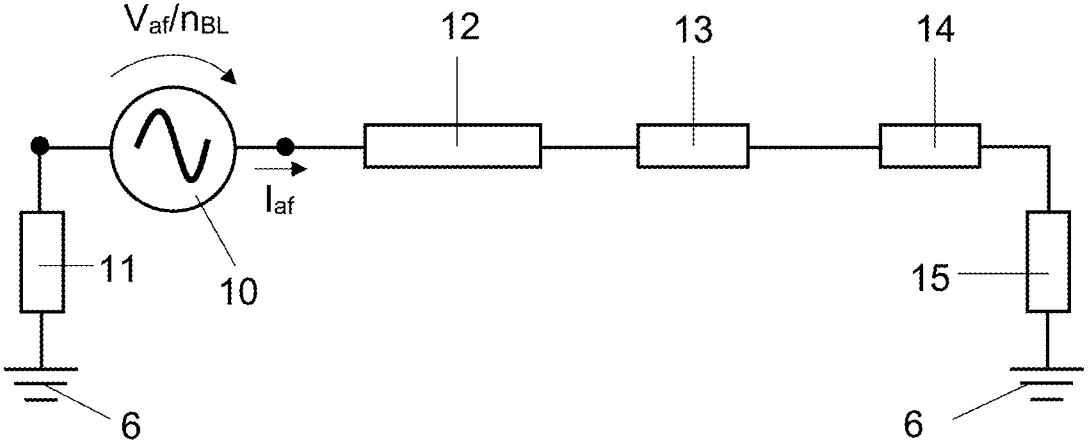
FIG. 2 shows a representation of the impedances imposed on the passage of high-frequency currents injected into the conductors feeding the electrical machine under test.

FIG. 2 shows a representation of the impedances imposed on the passage of high-frequency currents injected into the supply conductors 3 that feed the electrical machine 1 under test. The current $I_{af}$, resulting from the application of the voltage $V_{af}/n_{BI}$ by the high-frequency sinusoidal voltage source 10, encounters in the electrical circuit the impedance of the power supply system 11 composed of the parallel impedances of each of the power supply conductors 3 that feed the electrical machine 1 in series with the impedance of the power supply system 4; the impedance of the internal electrical insulation 12 of the electrical machine 1; the impedance of the electrical machine housing 13; the impedance of the ground branch 14; and the grounding impedance of the power system 15. It can be seen that the impedance of the grounding branch 14, the impedance of the electrical machine housing 13, and the grounding impedance of the power supply system 15 are practically zero. In addition, the impedances of the supply conductors 3 and the impedance of the supply system 4 are very low, while the impedance of the internal electrical insulation 12 of the electrical machine 1 under test is very high, in direct current, and can vary by tens of gigaohms. Thus, the equivalent impedance of the electrical circuit, which is the result of the relationship $(V_{af}/n_{BI})/I_{af}$, is practically given by the impedance of the electrical insulation 12 internal to the electrical machine 1, as it is the only impedance with a significantly high value.

It can also be seen that in the electrical circuit in FIG. 2, if grounding branch 5 of grounding mesh 6 is disconnected, the equivalent impedance of the circuit tends to infinity, showing the system that there has been a connection failure in the grounding of electrical machine 1.

Figure 3:
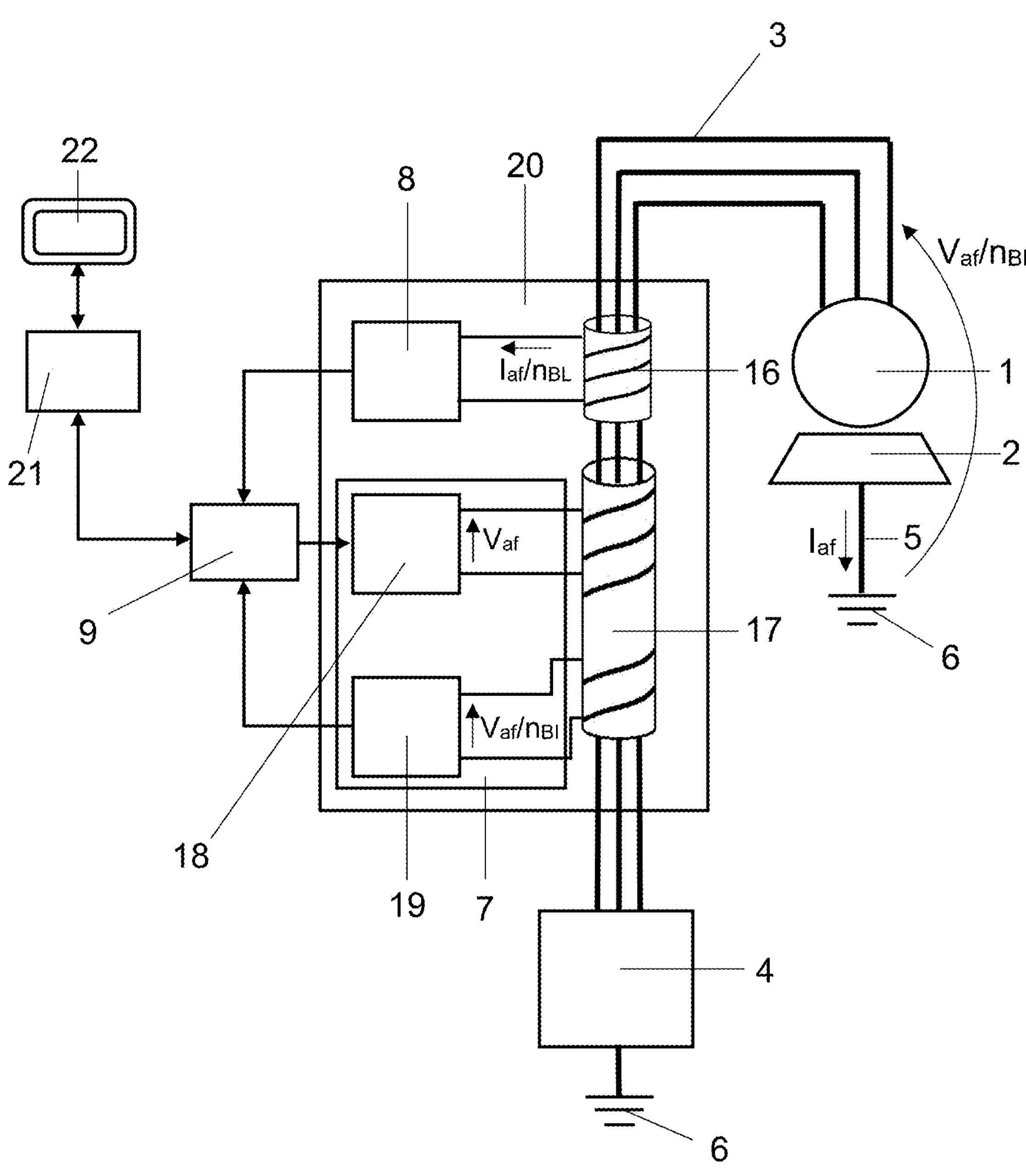
FIG. 3 shows a preferred block diagram of the system according to the present invention.

FIG. 3 shows another block diagram of the insulation condition analysis system for an electrical machine 1 operating on an example three-phase network. This diagram contains more details on each of the blocks shown more generally in FIG. 1 and some other modules whose use is preferential or optional. A scanning module 20 is attached to the supply conductors 3 of the electrical machine 1, which includes the functions of the voltage generator and reader block 7 and the current reader block 8. More specifically, the scanning module 20 comprises: at least one voltage generator and reader block 7, comprising a signal injector circuit 18 and a voltage reader circuit 19, an injection coil 17, a current reading coil 16 and a current reader circuit 8.

In turn, the injection coil 17 has two windings: an injector winding, which applies the voltage $V_{af}/n_{BI}$ to the supply conductors 3 together, resulting in the total high-frequency current $I_{af}$; and a voltage reading winding, which reads the voltage $V_{af}/n_{BI}$ also in the supply conductors 3 together, with $V_{af}$ being the voltage generated by the signal injector circuit 18 and $n_{BI}$ being the number of turns of the injector winding of the injection coil 17. The current reading coil 16 has a current reading winding that reads the high frequency current $I_{af}/n_{BL}$, where $I_{af}$ is the total high frequency current and $n_{BL}$ the number of turns of the reading coil winding. It is noteworthy that the signal injector circuit 18 amplifies and conditions the voltage signals to be applied to the injector winding of the injection coil 17, the voltage reader circuit 19 amplifies and conditions the voltage signal read by the reading winding of the injection coil 17, and the current reading circuit 8 amplifies and conditions the high frequency current signal $I_{af}$ read by the current reading coil (16).

The control module 9 has the function of synchronizing the generation of high frequency voltages $V_{af}$, readings of voltages $V_{af}/n_{BI}$ and readings of high frequency currents $I_{af}$ that flow through the machine's supply conductors 3 electrical 1. The analysis module 21 uses this data from the control module 9 to calculate the impedance of the electrical machine 1 in operation using the FRA technique. For the FRA technique, the scanning module 20 applies a wide range of frequencies to the electrical machine (1) under analysis and, with the data obtained, the impedance spectrum of the electrical machine 1 is calculated in the analysis module 21. Finally, the system can preferably also include an HMI-Human Machine Interface Module (22) to mediate the operation of the system with the user.

FIGS. 4*a* and 4*b* show, respectively, a schematic diagram of the injection coil 17 and the current reading coil 16 which are coupled to the supply conductors 3 of the electrical machine 1. Toroidal coils have cores 23 made of ferromagnetic materials, preferably nanocrystalline, which have a high relative permeability $\mu_r$ (e.g., around 280,000) so that the magnetic flux lines inside them are more easily established in their cores 23. The assembled supply conductors 3 run concentrically through the injection coil 17 and the current reading coil 16 so that they operate as a coil in relation to them. In these examples, coils 17, 16 involve all supply conductors 3 together. It is important to note that in the case of a single-phase machine, the coils involve the phase and neutral. The aim of the configuration involving all the conductors related to the power supply (whether phase or neutral) is to cancel out the effects of the fundamental frequency of the power supply current/voltage of electrical machine 1 on the operation of coils 16,17, whether for injection or reading.

FIG. 4*a* shows a representation of the injection coil 17 with an injector winding 24 that behaves like a voltage transformer whose primary is the winding itself with N turns and the secondary is the coil given by the supply conductors 3 that pass through it, and the voltage reading winding 25 which behaves like a voltage transformer whose primary is given by the coil of the supply conductors 3 and the secondary by the voltage reading winding 25 with K turns. N and K are determined based on the amplitude of the injection signal and the readout signal.

FIG. 4*b* shows a representation of the current reading coil 16 made up of the current reading winding 26 which behaves like a current transformer whose primary is the coil given by the supply conductor(s) 3 and the secondary by the current reading winding 26 with K turns.

FIG. 5 shows in more detail a possible hardware realization for scan module 20 and control module 9. In this exemplary embodiment, the control module 9 comprises a microprocessor submodule 27 which, in turn, comprises at least one microprocessor, at least one storage medium and a plurality of converters. These converters are responsible for converting digital signals generated by the microprocessor into analog signals, and converting analog signals from external sources into digital signals. The microprocessor also provides the digital signals for gain control of the signals read by the current reading coil 26, since their amplitude can vary greatly according to the impedance presented by the electrical machine 1 at the different high frequencies injected. The control module 9 may also comprise an analog interface 28 that couples the three analog signals: the signal for the injection of the high-frequency voltage $V_{af}$ through the inductive coupling of the injector winding 24 of the injection coil 17 with the supply conductors 3, the voltage signal $V_{af}/n_{BI}$ measured via inductive coupling by the reading winding of the voltage 25 of the injection coil 17 in the supply conductors 3 in relation to the frame 2 of the electrical machine 1, and the signal corresponding to the high frequency current $I_{af}$ that effectively circulates in the supply conductors 3 which is read by the current reading winding 26 of the current reading coil 16 which operates as a current transformer. It should be noted that at least one storage medium of the microprocessor submodule 27 is configured to store a set of instructions which, when executed, cause the microprocessor to carry out any steps necessary for operating the system according to the present invention.

In the scanning module 20, the injection signal is passed to the signal injector circuit 18, which converts it from common mode to differential mode, and also amplifies the signal so that it is supplied with a higher voltage level suitable for the injector winding 24 of the injection coil 17. The voltage signal from electrical machine 1 passes through the inverse process in the voltage reader circuit 19 coming from the voltage reading winding 25 of the injection coil 17. It is measured differentially between the supply conductors 3 and the housing 2 of the electrical machine 1, and converted to common mode. A similar process occurs in the current reader block 8, in which the current signal obtained by the current reading winding 26 of the current reading coil 16 enters the circuit in differential form and is converted to common mode. In this current reader block (8), the signal can be subjected to a controllable gain, set by the microprocessor of the control module (9), based on the amplitude of the signal received in the Digital-to-Analog Converter-DAC in order to make better use of its resolution.

The signals coming from the voltage reader circuit 19, which measures the voltage between the supply conductors 3 and the housing 2 of the electrical machine 1, and from the current reader block 8, which measures the high-frequency current circulating in the supply conductors 3. These are filtered to eliminate high-frequency noise before entering the DACs. This is because the DAC works at a frequency above that of the generation signal for calculating the impedance spectrum. For example, in a realization where the DACs work at 125 MHz and the maximum frequency of the generation signal is 10 MHz, the cut-off frequency of the filter can be approximately 15 MHz to ensure that there is no interference in the reading.

Figure 6:
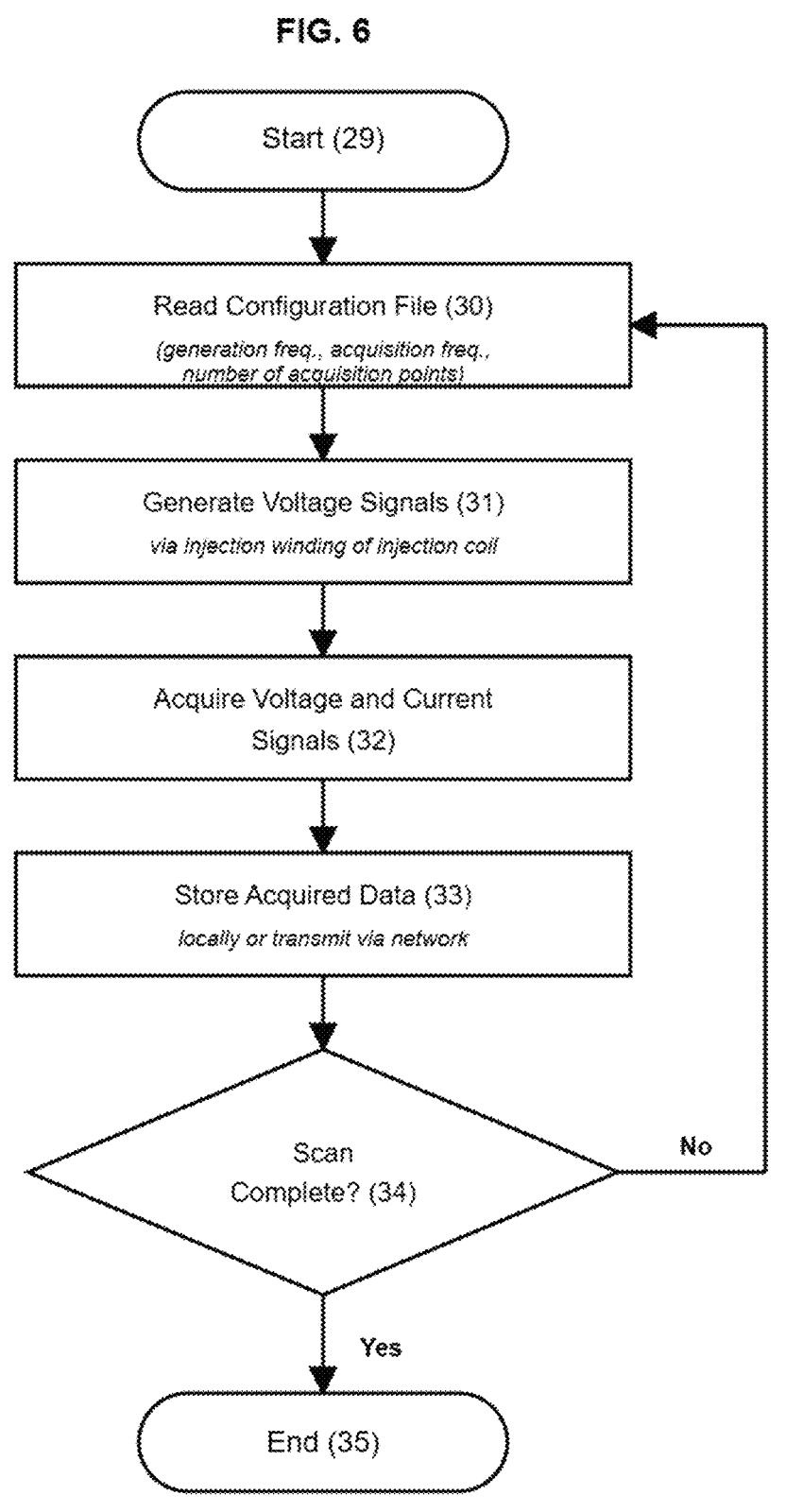

FIG. 6 shows a flowchart of an example of the algorithm to be executed in the control module 9 according to the present invention. In the context of this document, the term algorithm can be understood as synonymous with the term method and, consequently, they can be used interchangeably. The algorithm/method can, for example, be embedded via firmware in the control module 9 to perform low-level communication and control of the scan module 20 hardware. In one embodiment, this algorithm can be a set of instructions stored on a medium (for example, the medium of microprocessor submodule 27), together with the configuration file. This method is responsible for generating applied voltage signals $V_{af}$ and acquiring voltage signals $V_{af}/n_{BI}$ and current $I_{af}$.

In the preferred embodiment illustrated in FIG. 6, the instruction set can start 29 with the (optional) reading of a configuration file 30, which can be a CSV (Comma Separated Value) file with the following information for each frequency in the spectrum: generation frequency, acquisition frequency, number of acquisition points. In this preferred realization, the settings are stored in an editable CSV file; however, a technician in the field will note that such information does not necessarily need to be in a separate file and can be incorporated into the instruction set directly. The use of the file is a way of giving the user more freedom in the settings, without having to deal directly with the source code. Each set of information contained in each line of the file (whether CSV or not) can correspond to a point on the impedance spectrum, which will be constructed at the end of the scan.

The next steps of the algorithm are precisely to perform the frequency scan, that is: start the generation of high frequency signals 31, which in the injection coil 17 will be the high frequency voltage $V_{af}$ applied to the injector winding 24 of the injection coil 17. Soon after the start of signal generation, signal acquisition 32 begins, that is, obtaining $I_{af}$ and $V_{af}/n_{BI}$. At the same time as generating and acquiring the data, the collected data is stored locally in the memory of the control module 9 in volatile form or in a file, or transmitted via the network so that it can be stored remotely in the analysis module 21. After the previous steps, we check that the scan has been completed 34, i.e. that all the frequencies entered in the settings step 30 have been applied. For example, the method can check whether all the lines in a configuration file have been traversed. If "yes", the execution goes to the end 35 and terminates the execution of the algorithm; if "no", it returns to the configurations step 30 and the following steps are then repeated for the next frequency to be generated and analyzed.

Figure 7:
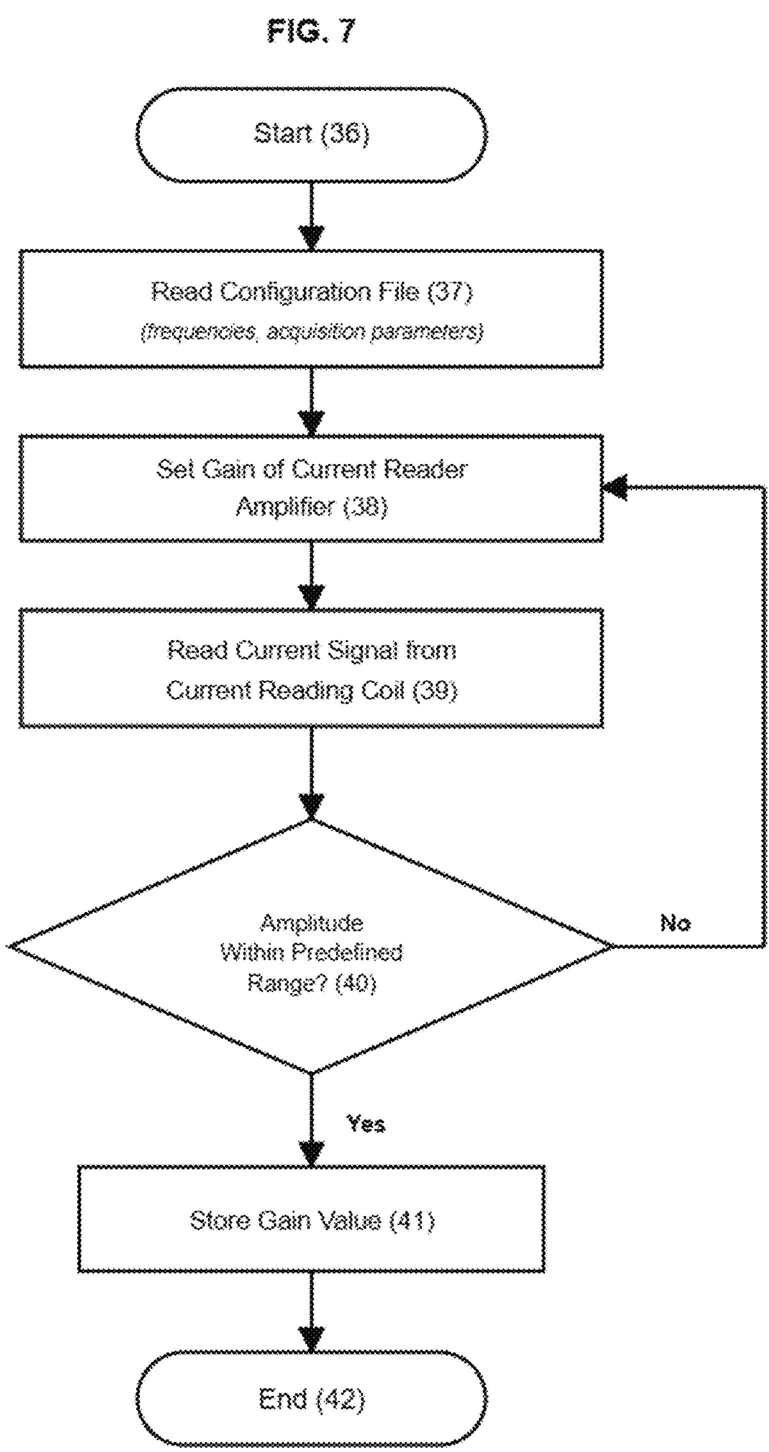
FIG. 7 shows a preferred flowchart of the algorithm for selecting the gains of the current reader circuit that amplifies the signals from reading the high-frequency current circulating in the power supply conductors of the electric machine.

FIG. 7 shows an exemplary flowchart of a preferred embodiment of the gain selection algorithm of the current reader block 8 that amplifies the signals arising from the reading of the high frequency current $I_{af}$ that circulates in the supply conductors 3 of the electrical machine 1. The algorithm begins 36 with the (optional) reading of a configuration file 37 where information about the frequencies to be generated and the acquisition of signals corresponding to $I_{af}$ and $V_{af}/n_{BI}$ are stored. Similarly to the configuration reading step 30 of the algorithm executed in control module 9, this step is optional since the necessary information can be incorporated into the instructions. The algorithm sets the gain 38 of the amplifier of the current reader block 8 and reads the current 39 using the signal acquired by the current reading coil 16 coupled to the supply conductors 3. Based on the signal read, the algorithm analyzes whether the amplitude is within the range 40 and if so, the gain value is stored 41 (for example in a CSV file) for later reading by the analysis module algorithm 21 and the algorithm is terminated 42. If not, i.e. if the signal is outside the predefined range, a new gain is chosen and the process repeated. This procedure is repeated until a gain within the predefined range is found or the process execution timeout is reached.

FIG. 8 shows a preferred flowchart of the scanning algorithm responsible for the process of generating, acquiring and processing signals at one or more frequencies in the analysis module 21. The aim of this algorithm is to obtain the spectra (impedance modulus, parallel resistance, parallel capacitance and tangent delta) and the ASLE statistical indicators, which are used to analyze the insulation condition of electrical machine 1. This algorithm works with the algorithm for control module 9, shown above in FIG. 6. Accordingly, FIG. 8 shows a more detailed preferred flowchart of the method according to the present invention, comprising the flowcharts of the algorithms of the control module 9 and the analysis module 21.

The analysis process shown in the preferred flowchart in FIG. 8 begins with the user operating an analysis software configured to perform the method according to the present invention using a system according to the present invention. In this preferred realization, the software will be the controller of all the actions carried out during the scans. The first step carried out by the algorithm is to connect to the remote device (44), i.e. connect to the hardware of the system according to the present invention that is installed next to a given electrical machine 1, and execute the set of instructions responsible for the high-frequency scanning process. This remote access can be done, for example, via the SSH protocol (Secure Shell Protocol). If the attempt to make a connection (45) fails ("does not" take place), i.e. if it fails for some reason (e.g. communication failure, power failure, invalid access credentials, etc.), the algorithm is terminated and, preferably, a message regarding the error is given to the user. If the connection is successful ("yes"), the algorithm executes the set of instructions from the algorithm in control module 9 and waits for scan 46 to finish. When the scan is complete, the algorithm collects the data 47 by loading the data obtained by the control module hardware 9 into the analysis module 21. For example, you can use the SFTP protocol (Secure File Transfer Protocol). Once the data is available, the algorithm calculates the impedance spectrum 48 with at least one impedance, one parallel resistance, one parallel capacitance and one delta tangent. It then calculates the ASLE statistical indicators 49 and stores 50 in the analysis module 21, or remotely, both the processed signals and the impedances, parallel resistances, parallel capacitances, delta tangents and ASLE statistical indicators obtained, and the algorithm ends 51 its execution.

Figure 9A:
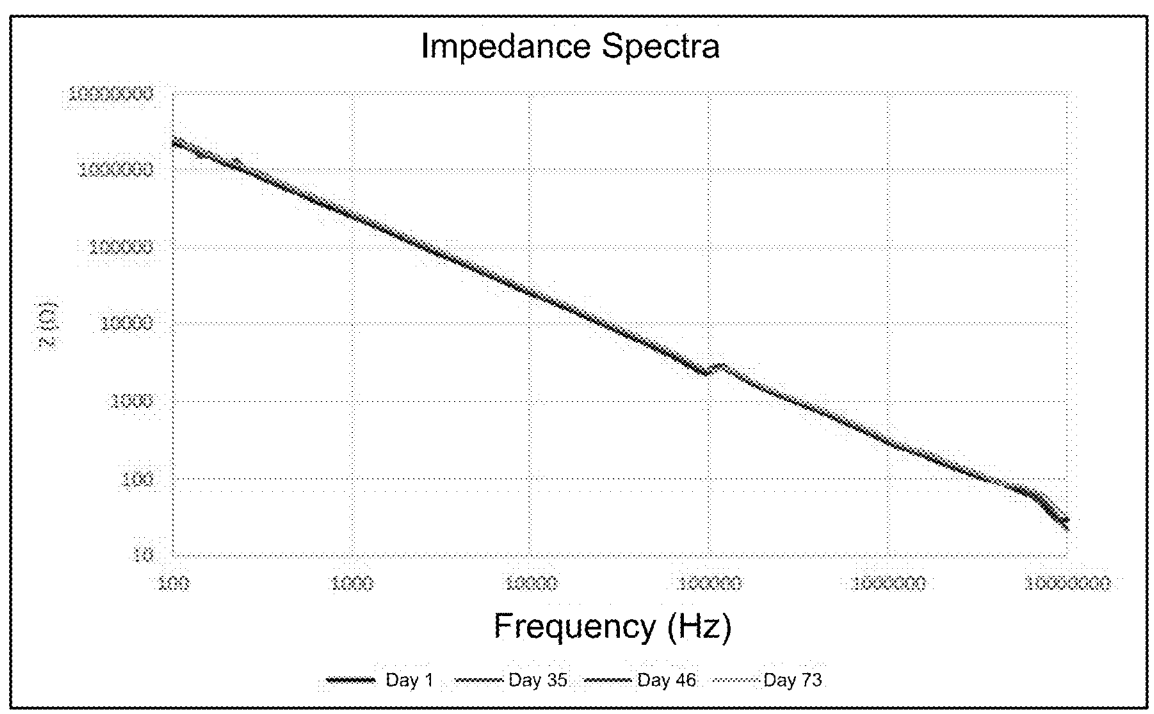
FIGS. 9*a*-9*c* show the experimental results of the impedance spectra, using the ASLE statistical indicator, obtained for a 200 HP, three-phase, cage-type motor, powered at a low voltage of 220 Volts.
Figure 9B:
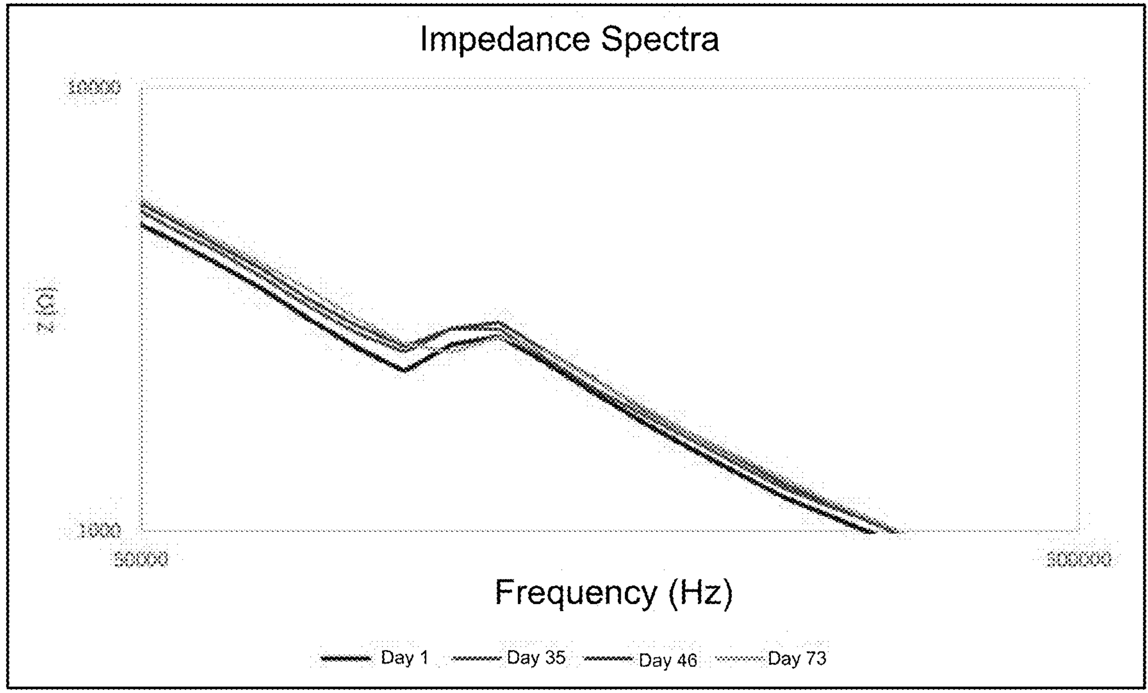
Figure 9C:
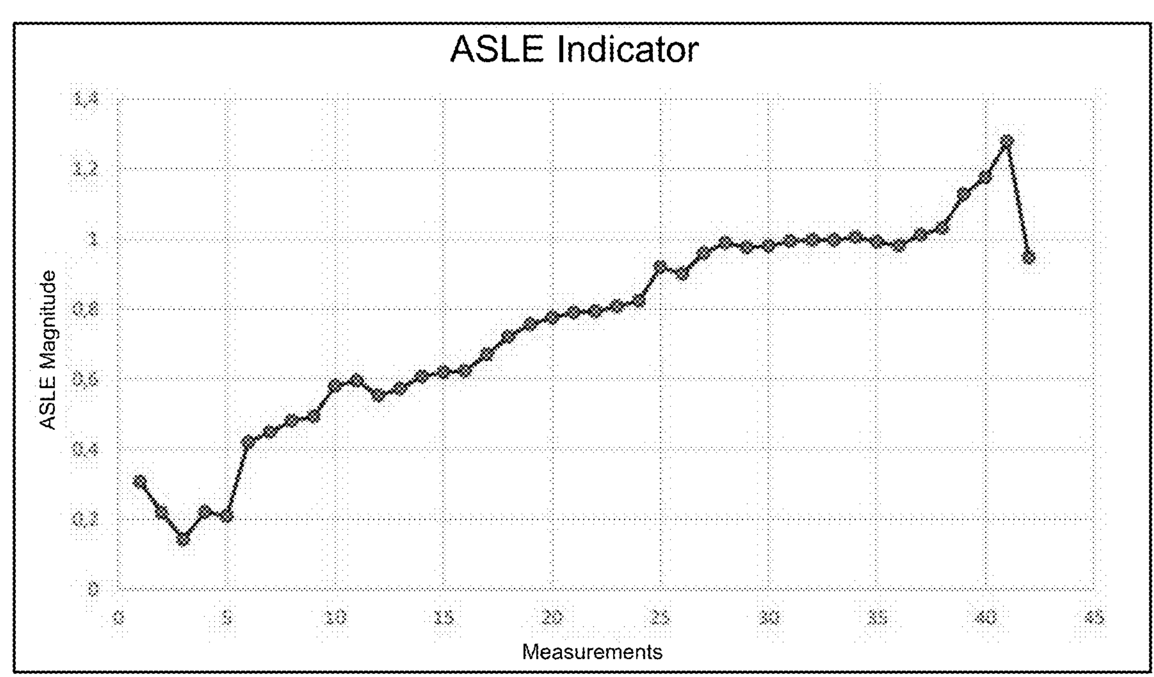

FIGS. 9*a*-9*c* show the experimental results of the impedance spectra and the use of the ASLE statistical indicator obtained for a 200 hp, three-phase, cage-type motor powered at a low voltage of 220 volts. FIG. 9*a* shows 4 spectra of the engine under analysis; the data was collected on different days of the test. Day 01 is the initial spectrum of the test, therefore the Baseline Impedance Spectrum that will be used in the statistical analyses. Day 73 is the spectrum obtained with the engine in failure. The other two spectra, obtained on day 35 and day 46, are intermediate spectra between the base spectrum and the fault spectrum.

FIG. 9*b* shows a zoom of the Impedance Spectra shown in FIG. 9*a*, in the 50 kHz to 500 KHz range. You can visually see the differences between the spectra presented. However, it is still difficult to measure the differences between the curves, leaving room for subjectivity in the analysis.

FIG. 9*c* shows the application of the ASLE statistical indicator to the data collected in the impedance spectra for the measurements taken between days 1 and 45 in order to obtain a more objective analysis of the data. Through its application, it can be seen that when analyzing the data from the FRA, significant deterioration is now easily identified, making it possible to detect changes in the insulation of electrical machine 1 at an early stage. The graph shows that on the measurement on day 42 there was a break in the ASLE indicator curve, identifying a fault in the insulation of electrical machine 1. This was caused by the breakage of one of the phases and not by an earth fault, caused by the ageing of the winding insulation, the enamel on the wires, which led to the breakage of a winding on the motor under test.

Just as the ASLE indicator was applied to the impedance spectra data obtained, it can also be applied to the parallel resistance, parallel capacitance and tangent delta spectra data obtained.

FIG. 10 shows the main synoptic screens of an example implementation of the HMI-Human Machine Interface 22 module for operating the system that detects faults and deterioration in the insulation of electrical machines in operation.

Figure 10A:
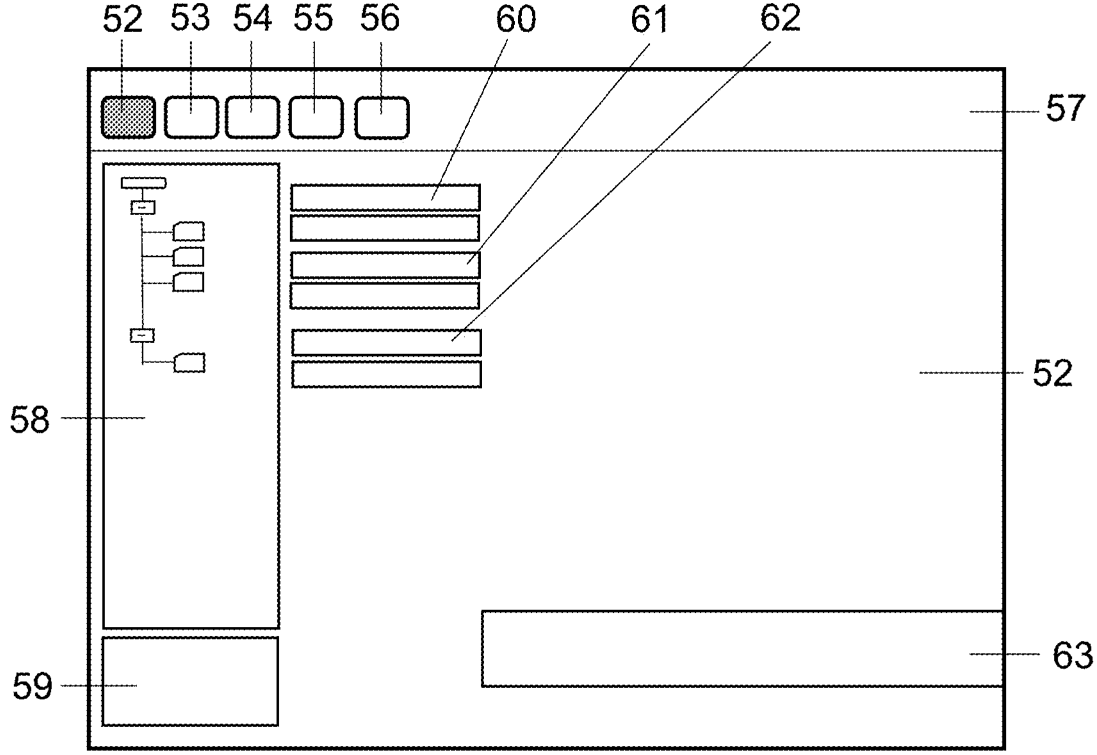
FIGS. 10 to 10*e* show the main simplified screens of an example implementation of the HMI-Human Machine Interface module for operating the fault and insulation deterioration detector system for electrical machines in operation.

FIG. 10*a* shows the general screen 52, with the system name 57 and the icons for the main quick access screens: general screen 52, analysis screen 53, scan screen 54, time signal screen 55 and indicators screen 56. The left sidebar shows the menu of electrical machines 58 registered in the system with the respective directory trees and data files for each of them, separated by user-organized sections, and the board data table 59 for the selected electrical machine 1. In the central part of the screen are the general information icons for the selected electrical machine 1, with the machine name and number 60, the scan used 61 with the number of points on the frequency graph and the frequency range, e.g. 1 kHz to 10 MHz, and the ASLE Indicator (62) with the frequency range it will cover in the analysis, e.g. 100 kHz to 1 MHZ. At the bottom of the screen there is a comments box (63) where the user can enter comments they consider important in relation to the selected machine.

Figure 10B:
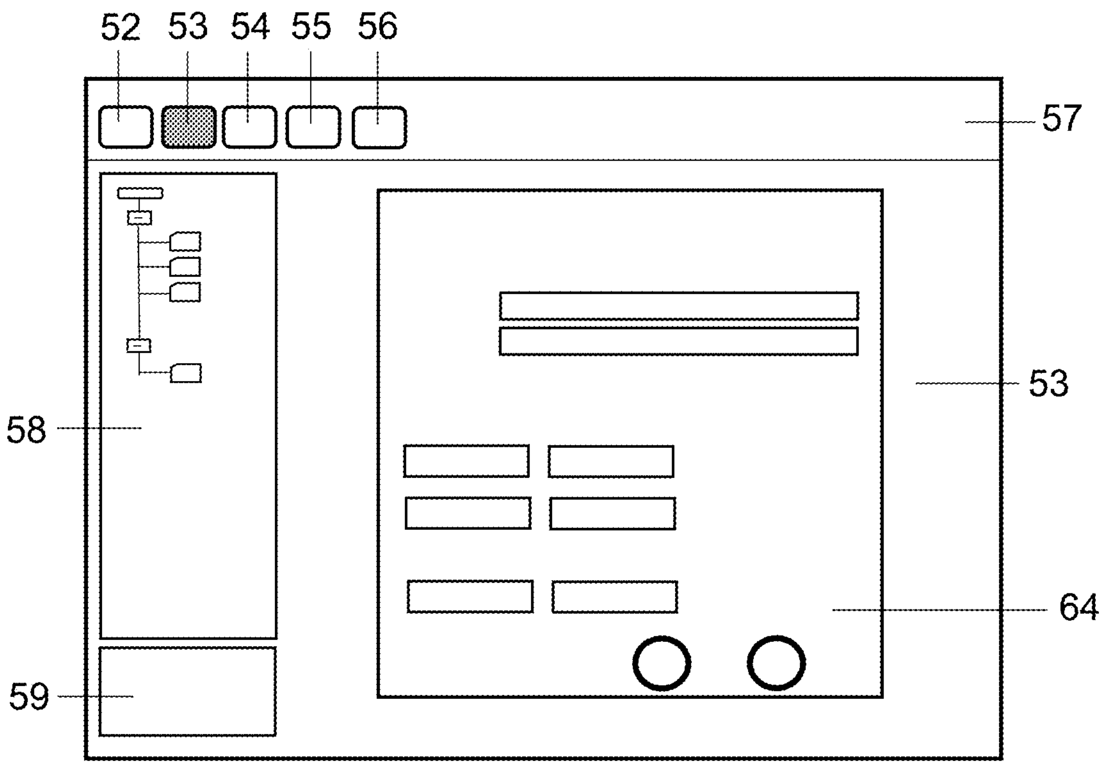

FIG. 10*b* shows analysis screen 53 with parameter box 64 for the selected electrical machine 1, where the following data is programmed: Connection (name and number of the machine, computer network it is on, IP address and port); Analysis (statistical indicator, index, initial and final frequency of evaluation by the indicator); Scanning (number of points, initial and final scanning frequency); and Alerts (upper alert value and percentage for the emergency level alert).

The method and system automatically determine the occurrence of faults or deterioration in the insulation of electrical machine 1 based on the ASLE indicators applied to the impedance spectra obtained; signaling to the user on the 56 indicator screen if: i) the indicator has passed a given upper or lower value pre-defined by the user for each type and model of motor, generator or transformer depending on its design and construction characteristics and its basic impedance spectrum ("baseline"); ii) the indicator at a given time has shown a percentage deviation lower or higher than the value of the previous value calculated.

Figure 10C:
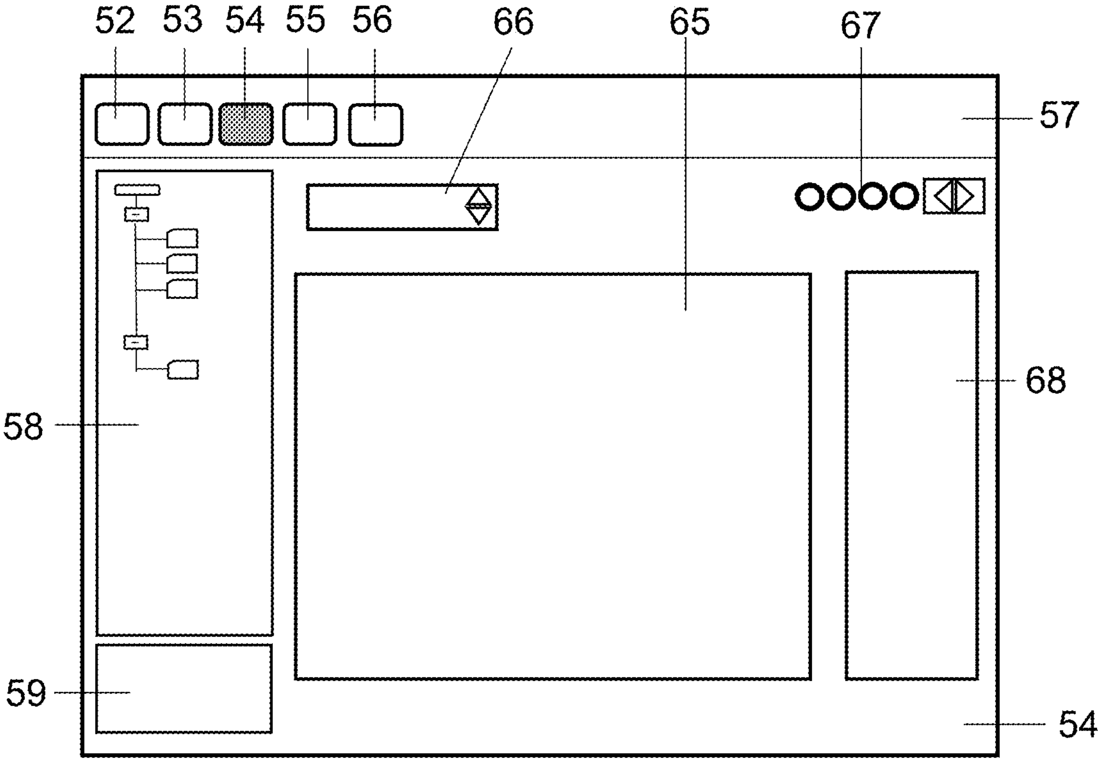

FIG. 10*c* shows the scanning screen 54 used for the acquisition and visual analysis of the graphs of the spectra 65 obtained by the system. Graphical analysis of the spectra allows the user to detect patterns in the spectra and correlate them with the types of faults observed in the electrical machine 1 under analysis. The graph selection button 66 allows the user to select the spectra of the impedance modules, parallel resistances, parallel capacitances and/or delta tangents. The graph 67 operation buttons allow the user to format the displayed graphs and select the plotting period and frequency, resistance, impedance, capacitance and tangent values on the axes. On the right-hand side is the scan acquisition board 68 where the measurement periods to be taken are programmed with the dates and times when the scans are to begin. The program is scanning 1000 points in approximately 2 minutes, so each point in the spectrum lasts approximately 0.12 seconds.

Figure 10D:
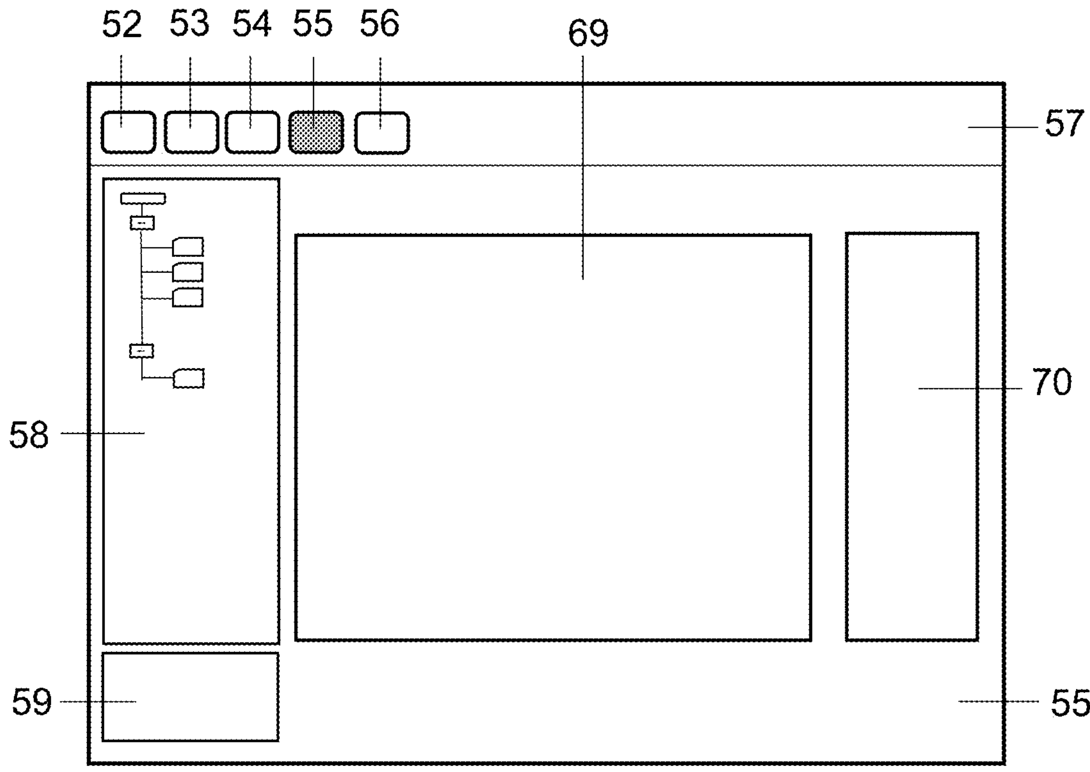

FIG. 10*d* shows the signal screen at time 55. It is used for visual analysis of the voltage signals obtained by the system, in the form of oscillograms 69. In one of the channels, the voltage $V_{af}/n_{BI}$ obtained between the power supply conductors 3 and the housing of the electrical machine 2 under analysis can be visualized. In the other channel, one can observe the voltage signal read in the current reading coil 16, which is proportional to the current $I_{af}$ that effectively circulates in the closed circuit given by the supply conductors 3, the housing 2 of the electrical machine 1, the branch grounding grid 5, the grounding mesh 6 and the power supply system 4. Visual analysis of the signals over time allows the user to identify problems related mainly to the system itself. In this way, it is possible, for example, to diagnose faults in the signal generation and acquisition systems, as well as in the system's own electronics and interconnection cables. This eliminates erroneous conclusions regarding the electrical machine 1 being analyzed. The measurement table 70 shows the values related to: date and time of acquisition, frequency, signal duration and maximum and minimum signal points.

Figure 10E:
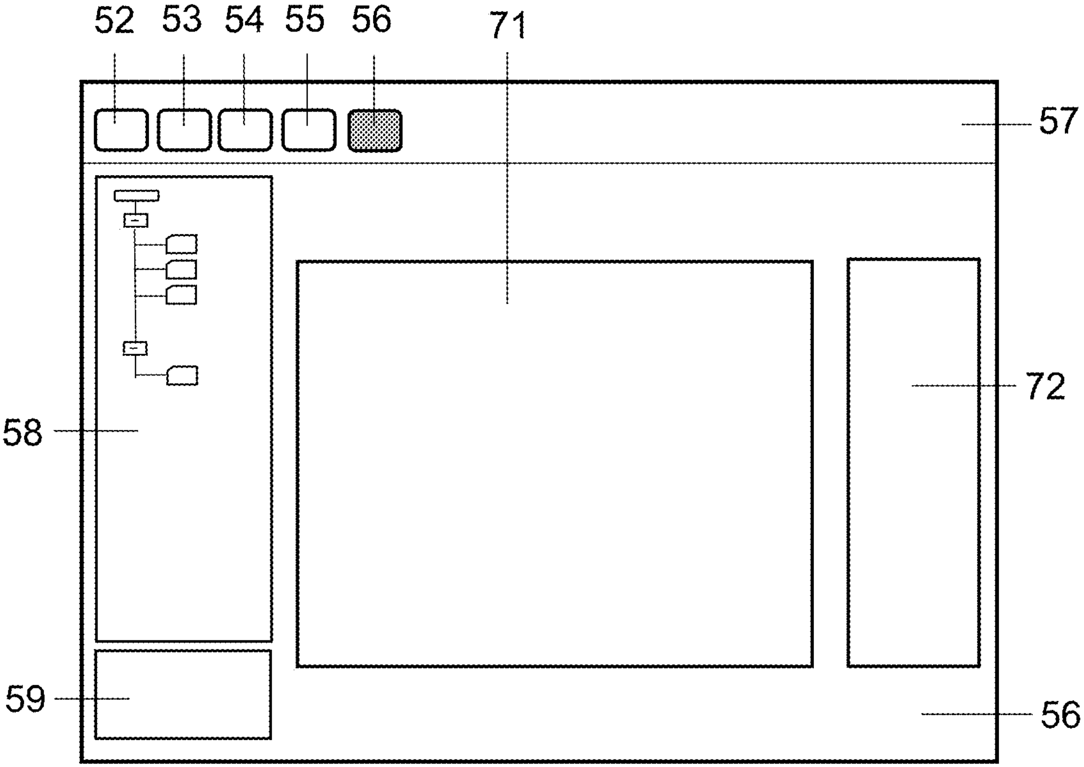

FIG. 10*e* shows the ASLE statistical indicators 56 screen used by the analysis module 21. Each indicator is linked to a frequency range and there may be several indicators for the same spectrum. The center of the screen shows the time progression graph of indicator 71 with the selected frequency range or range of occurrence times on the abscissa axis, the alert and emergency alert level lines. On the side, the indicator acquisition table 72 with general information on electrical machine 1: machine name and number, IP address, base impedance spectrum; the selected analysis: name of the analysis, index used, frequency range; and of the point selected on the graph: type of spectrum used in the analysis, name of the analysis, value of the point, date and time of acquisition.

Logically, the new method and system for detecting faults and degradations in the insulation of electrical machines via the conductors that feed them through frequency response analysis presented here has as its main inventive activity the analysis of frequency response through the injection of high frequency signals into the supply phases 3 of the electrical machine 1 and the corresponding readings of the currents actually circulating in the cables of the supply phases. The main inventive activity presented here is the analysis of frequency response by injecting high-frequency signals into the supply phases 3 of electrical machine 1 and the corresponding readings of the currents actually circulating in the cables of the supply phases 3 and the voltages developed in the cables. This can include the use of different variables, statistical indicators and criteria for defining the diagnosis and alerts. The basic constituent elements can be made of different materials and technologies, without losing the novelty and innovation presented in this invention patent.

The invention claimed is:

1. A system for analyzing the insulation condition of an electrical machine, the electrical machine comprising a housing, a plurality of supply conductors, and at least one grounding branch, the system comprising:

at least one scanning module coupled to the plurality of supply conductors, the scanning module comprising at least one injection coil and at least one current reading coil externally positioned around the plurality of supply conductors, wherein the at least one injection coil comprises an injection winding and a voltage reading winding, and the at least one current reading coil comprises a current reading winding;

at least one control module coupled to the scanning module, the control module comprising at least one microprocessor, at least one storage medium, and a plurality of converters; and at least one analysis module coupled to the control module, the analysis module comprising at least one processor configured to execute spectral processing algorithms;

wherein the scanning module is configured to inject and measure, via electromagnetic induction through the at least one injection coil, a plurality of voltage signals having frequencies in a range of 1 kHz to 10 MHz between the housing of the electrical machine and the plurality of supply conductors, and to measure, via electromagnetic induction through the at least one current reading coil, a plurality of currents circulating in the plurality of supply conductors in response to the injection of each of the plurality of voltage signals, the injection and measurement being performed without galvanic contact between the system and the plurality of supply conductors;

wherein the control module is configured to control and synchronize the injections and measurements of the scanning module and send measurement data to the analysis module; and wherein the analysis module is configured to process the data received from the control module and determine the condition of the insulation by calculating at least one statistical indicator based on a comparison of a measured frequency response of the electrical machine with a stored baseline frequency response of the electrical machine.

2. The system according to claim 1, wherein:

the at least one injection coil is coupled to the plurality of supply conductors that feed the electrical machine such that the plurality of supply conductors pass concentrically through the injection coil;

a signal injector circuit is coupled to the injection winding, configured to inject the plurality of voltage signals having frequencies in the range of 1 kHz to 10 MHz into the plurality of supply conductors via electromagnetic induction through the injection winding of the injection coil;

a voltage reader circuit is coupled to the voltage reading winding, configured to read the plurality of voltage signals on the plurality of supply conductors via electromagnetic induction through the voltage reading winding of the injection coil; and a current reader circuit is coupled to the current reading winding of the current reading coil, configured to read the plurality of currents circulating in the plurality of supply conductors via electromagnetic induction through the current-reading winding of the current reading coil.

3. The system according to claim 2, wherein the at least one injection coil and the at least one current reading coil comprise toroidal cores of ferromagnetic material, preferably nanocrystalline, having a high relative permeability.

4. The system according to claim 1, wherein the control module further comprises:

the at least one microprocessor and the plurality of converters coupled to the analysis module, and at least one analog interface coupled to at least one signal injector circuit, at least one voltage reader circuit, and at least one current reader circuit;

wherein the microprocessor and the plurality of converters are configured to:

convert digital signals generated by the microprocessor into analog signals for injection via the injection winding;

convert analog signals received from the scanning module into digital signals; and provide digital signals to control a gain of the current reader circuit;

wherein the analog interface allows coupling between the microprocessor and the converters and the scanning module for sending and receiving analog and digital signals.

5. The system according to claim 1, further comprising a human-machine interface module coupled to the analysis module to allow remote operation of the system by a user.

6. The system according to claim 1, wherein the measured frequency response comprises at least one of an impedance spectrum calculated from a Frequency Response Analysis (FRA) or a Sweep Frequency Response Analysis (SFRA), a parallel resistance spectrum, a parallel capacitance spectrum, and a tangent delta spectrum.

7. The system according to claim 1, wherein the at least one statistical indicator is an Absolute Sum of Logarithmic Error (ASLE) indicator, calculated as a point-by-point cumulative logarithmic error summation between the measured frequency response and the stored baseline frequency response.

8. The system according to claim 1, wherein the electrical machine is in operation and energized at nominal power during the analysis, and the scanning module performs the injection and measurement without interrupting or interfering with a power circuit of the electrical machine.

9. The system according to claim 1, wherein the electrical machine is a medium-voltage or high-voltage machine operating at voltages of 1,000 V or greater, and the scanning module is configured to perform the injection and measurement while the electrical machine is energized, without requiring de-energization of the electrical machine.

10. A method for insulation condition analysis of an electrical machine using the system as defined in claim 1, the electrical machine comprising a housing, a plurality of supply conductors, and at least one grounding branch, the method comprising:

generating, via at least one scanning module comprising at least one injection coil externally positioned around the plurality of supply conductors, predetermined voltage signals having frequencies in a range of 1 kHz to 10 MHz on the plurality of supply conductors by electromagnetic induction through an injection winding of the injection coil, without galvanic contact between the scanning module and the plurality of supply conductors;

acquiring, through the at least one scanning module, data from a plurality of voltage signals via a voltage reading winding of the injection coil and a plurality of currents in the plurality of supply conductors via a current reading winding of a current reading coil, by electromagnetic induction;

storing the acquired data via the control module;

collecting and loading the data acquired by the control module into the analysis module;

calculating, using the analysis module, at least one impedance spectrum from the acquired data; and calculating, using the analysis module, at least one statistical indicator from a comparison of the at least one impedance spectrum with a stored baseline impedance spectrum to determine the condition of the electrical machine insulation.

11. The method according to claim 10, further comprising remotely accessing the system installed at the electrical machine to control the execution of the method, wherein an error message is displayed if the access fails.

12. The method according to claim 10, wherein the at least one calculated impedance spectrum is made on the basis of Frequency Response Analysis (FRA) or Sweep Frequency Response Analysis (SFRA).

13. The method according to claim 10, wherein the at least one statistical indicator is an Absolute Sum of Logarithmic Error (ASLE) indicator, calculated as a point-by-point cumulative logarithmic error summation between the at least one impedance spectrum and the stored baseline impedance spectrum.

14. The method according to claim 10, wherein storing the acquired data comprises:

storing data, at least in part, locally on storage media in the control module; or sending data via a network, through the control module, to be stored, at least in part, remotely.

15. The method according to claim 14, wherein collecting and loading the data into the analysis module comprises requesting the acquired data from the control module, the data having been stored locally or remotely.

16. The method according to claim 11, further comprising:

before the step of generating, reading a configuration file comprising, for each of the voltage signals having frequencies in the range of 1 kHz to 10 MHz, at least one of: a generation frequency, an acquisition frequency, and a number of acquisition points.

17. The method according to claim 10, comprising:

sequentially performing the steps of generating, acquiring, and storing for each of the plurality of voltage signals having frequencies in the range of 1 kHz to 10 MHz; and repeating the sequence until all the predetermined frequencies have been stored.

18. The method according to claim 10, wherein the acquiring step further comprises adjusting and storing the value of at least one gain of signals measured by the scanning module so that an amplitude of the signals is within a predetermined range.

19. The method according to claim 10, further comprising calculating, from the at least one impedance spectrum, at least one of a parallel resistance, a parallel capacitance, and a tangent delta.

20. A non-transitory storage medium comprising instructions which, when executed by a processor, cause the processor to perform the method as claimed in claim 10.

* * * * *